United States Patent
Yokota

(10) Patent No.: US 11,355,844 B2
(45) Date of Patent: Jun. 7, 2022

(54) MATCHING CIRCUIT AND ANTENNA DEVICE

(71) Applicant: YOKOWO CO., LTD., Tokyo (JP)

(72) Inventor: Yusuke Yokota, Tomioka (JP)

(73) Assignee: YOKOWO CO., LTD., Tokyo (JP)

( * ) Notice: Subject to any disclaimer, the term of this patent is extended or adjusted under 35 U.S.C. 154(b) by 0 days.

(21) Appl. No.: 17/050,014

(22) PCT Filed: Apr. 15, 2019

(86) PCT No.: PCT/JP2019/016183
§ 371 (c)(1),
(2) Date: Oct. 23, 2020

(87) PCT Pub. No.: WO2019/208309
PCT Pub. Date: Oct. 31, 2019

(65) Prior Publication Data
US 2021/0242585 A1    Aug. 5, 2021

(30) Foreign Application Priority Data
Apr. 26, 2018 (JP) .............................. JP2018-085810

(51) Int. Cl.
*H01Q 5/335* (2015.01)
*H01Q 5/50* (2015.01)
*H01Q 1/32* (2006.01)

(52) U.S. Cl.
CPC .......... *H01Q 5/335* (2015.01); *H01Q 1/3233* (2013.01); *H01Q 5/50* (2015.01)

(58) Field of Classification Search
CPC .... H01Q 1/3233; H01Q 1/1214; H01Q 1/362; H01Q 1/3275; H01Q 5/335; H01Q 5/50
See application file for complete search history.

(56) References Cited

U.S. PATENT DOCUMENTS 5,258,728 A * 11/1993 Taniyoshi ................ H01Q 1/10
                                                          333/132
8,659,496 B1    2/2014 Furey
(Continued)

FOREIGN PATENT DOCUMENTS

EP    2026473 A1    2/2009
JP    6-252791 A    9/1994
(Continued)

OTHER PUBLICATIONS

International Search Report and Written Opinion dated Jul. 2, 2019 for PCT/JP2019/016183 filed on Apr. 15, 2019, 6 pages including English Translation of the International Search Report.
(Continued)

*Primary Examiner* — Lam T Mai
(74) *Attorney, Agent, or Firm* — Xsensus LLP

(57) ABSTRACT

An antenna device configured to be attached to a vehicle includes: an antenna of a resonance type; and a matching circuit connected to the antenna, wherein the matching circuit includes a first matching circuit connected to a feeding portion of the antenna and a second matching circuit connected to a subsequent stage of the first matching circuit, wherein the first matching circuit reduces an impedance in a frequency band that is away to a higher-frequency range or a lower-frequency range from a resonance point of the antenna such that the impedance is lower than before connection of the first matching circuit, and the second matching circuit increases an impedance in a vicinity of the resonance point of the antenna such that the impedance is higher than before connection of the second matching circuit.

7 Claims, 26 Drawing Sheets

(56) References Cited

U.S. PATENT DOCUMENTS

| | | | |
|---|---|---|---|
| 2002/0126050 A1* | 9/2002 | Oshiyama | H01Q 1/243 343/702 |
| 2009/0278748 A1 | 11/2009 | Sako et al. | |
| 2012/0162025 A1* | 6/2012 | Ohno | H01Q 3/00 343/702 |
| 2017/0077596 A1 | 3/2017 | Ortigosa et al. | |

FOREIGN PATENT DOCUMENTS

| | | |
|---|---|---|
| JP | 11-261363 A | 9/1999 |
| JP | 2001-185937 A | 7/2001 |
| JP | 2015-73200 A | 4/2015 |

OTHER PUBLICATIONS

Extended European search report dated Dec. 23, 2021, in corresponding European patent Application No. 19792783.3, 11 pages.

\* cited by examiner (CL TYPE)

(LC TYPE)

(IMPEDANCE STATE OF POLE ANTENNA)

(1) (SHUNT L) → (2) (SERIES C)

(VSWR-FREQUENCY CHARACTERISTICS)

(GAIN-FREQUENCY CHARACTERISTICS)

(COMPARATIVE EXAMPLE 1)

(COMPARATIVE EXAMPLE 2)

(COMPARATIVE EXAMPLE 3)

(COMPARATIVE EXAMPLE 4)

(COMPARATIVE EXAMPLE 5)

(1) (SERIES C)  
(2) (SHUNT L)

(VSWR-FREQUENCY CHARACTERISTICS)

(GAIN-FREQUENCY CHARACTERISTICS)

(1) (SERIES L)   (2) (SHUNT C)

(1) (SHUNT L) ⇒ (2) (SERIES L)

(VSWR-FREQUENCY CHARACTERISTICS)

(GAIN-FREQUENCY CHARACTERISTICS)

(1) (SHUNT C) → (2) (SERIES C)

(VSWR-FREQUENCY CHARACTERISTICS)

(GAIN-FREQUENCY CHARACTERISTICS)

(VSWR-FREQUENCY CHARACTERISTICS)

(GAIN-FREQUENCY CHARACTERISTICS)

(1) (SERIES C)    (2) (SHUNT L)    (3) (SERIES C)

(VSWR-FREQUENCY CHARACTERISTICS)

(GAIN-FREQUENCY CHARACTERISTICS)

(1) (SERIES C)  (2) (SHUNT C)  (3) (SERIES L)

(VSWR-FREQUENCY CHARACTERISTICS)

(GAIN-FREQUENCY CHARACTERISTICS)

(1) (SERIES L)  (2) (SHUNT L)  (3) (SERIES C)

(VSWR-FREQUENCY CHARACTERISTICS)

(GAIN-FREQUENCY CHARACTERISTICS)

(1) (SHUNT C)
(2) (SERIES L)
(3) (SHUNT L)
(4) (SERIES C)

(VSWR-FREQUENCY CHARACTERISTICS)

(GAIN-FREQUENCY CHARACTERISTICS)

MATCHING CIRCUIT AND ANTENNA DEVICE

CROSS-REFERENCE TO RELATED APPLICATIONS

The present application is based on PCT filing PCT/JP2019/016183, filed Apr. 15, 2019, which claims priority to JP 2018-085810, filed Apr. 26, 2018, the entire contents of each are incorporated herein by reference.

BACKGROUND OF THE INVENTION

Field of the Invention

The present invention relates to a matching circuit connected to an antenna having a low profile with respect to a resonance wavelength, for example, an antenna device for vehicle, and an antenna device for vehicle provided with the matching circuit.

DESCRIPTION OF THE RELATED ART

In an antenna device for vehicle, an impedance matching circuit is typically added between an antenna and a subsequent amplifier circuit. For example, in the antenna device disclosed in Patent Literature 1, an inductor (coil) 23 and a capacitor (condenser) 24 are connected in series (series-connected) to a feeding portion of an antenna 1, and a matching circuit (FIG. 1) in which an inductor 21 and a capacitor 22 each having one of their respective both ends ground-connected (shunt-connected) are inserted for connection is added immediately before a subsequent circuit (for example, a PIN diode). Patent Literature 2 discloses a matching circuit (FIG. 5) to which a series-connected inductor L and a shunt-connected capacitor C are connected. Further, Patent Literature 3 discloses a matching circuit 70 (FIG. 1) that has a shunt-connected capacitor 72 and a series-connected inductor 74 between a filter 3 and an amplifier 76 on an antenna side. Since a reflection from the amplifier 76 (f point) poses a problem to the matching circuit 70, the shunt-connected capacitor 72 is provided immediately before the filter 3.

Each of the above-described matching circuits allows a signal having a specific frequency to pass therethrough and blocks signals having other frequencies. In addition, circuit constants such as a capacitor C and an inductor L are determined such that a VSWR is minimized and a gain is maximized at a resonance point (resonance frequency).

PRIOR ART DOCUMENTS

Patent Literature

Patent Literature 1: Japanese Patent Laid-Open No. 2015-73200
Patent Literature 2: Japanese Patent Laid-Open No. H06-252791
Patent Literature 3: Japanese Patent Laid-Open No. H11-261363

In the matching circuits disclosed in Patent Literatures 1, 2, and 3, a good gain is obtained at the resonance point, but the gain rapidly decreases as the frequency departs from the resonance point. In addition to the fact that the height or length of the antenna is shorter compared to the resonance wavelength, it is considered that this is partly caused by an existence of a circuit component that is shunt-connected immediately before connection to the subsequent stage of the matching circuit. In addition, a dual-frequency matching circuit 3 (FIG. 1) disclosed in Patent Literature 2 sets a difference in SWR fluctuation between two frequencies (f1, f2) to 1.5 or less by cascading two sets of an inductor L that is series-connected to the feeding portion of the antenna 1 and a capacitor C that is shunt-connected thereto.

However, in such matching circuits, not only is it difficult to adjust constants of the circuits connected to each other, but also the SWR rapidly increases at frequencies below the low frequency f1 and above the high frequency f2.

For this reason, for example, in a case where the frequency band (76 MHz to 95 MHz) used in Japan is different from the frequency band (87.5 MHz to 108 MHz) used in countries other than Japan as in the FM waveband, different matching circuits must be separately prepared even for the same antenna.

The main object of the present invention is to provide an antenna device capable of reducing the difference between a maximum value and a minimum value of gain, of a desired frequency band, from the low-frequency range that is away from the resonance point to lower frequencies to the high-frequency range that is away therefrom to higher frequencies.

SUMMARY OF THE INVENTION

The antenna device of the present disclosure includes an antenna device configured to be attached to a vehicle, comprising: an antenna of a resonance type; and a matching circuit connected to the antenna, wherein the matching circuit includes a first matching circuit connected to a feeding portion of the antenna and a second matching circuit connected to a subsequent stage of the first matching circuit, wherein the first matching circuit reduces an impedance in a frequency band that is away to a higher-frequency range or lower-frequency range from a resonance point of the antenna such that the impedance is lower than before connection of the first matching circuit, and the second matching circuit increases an impedance in a vicinity of the resonance point of the antenna such that the impedance is higher than before connection of the second matching circuit.

DESCRIPTION OF THE EMBODIMENTS

Examples of embodiments of the present invention applied to an antenna device for vehicle will be described below.

First Embodiment

Figure 1:
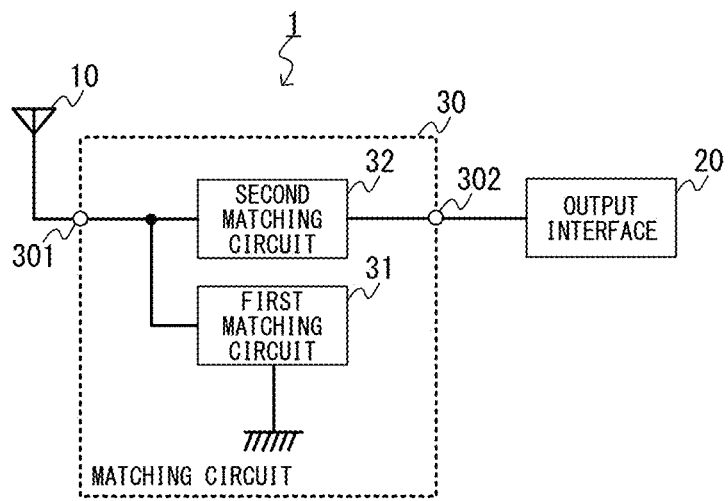
FIG. 1 is a function configuration diagram of an antenna device according to a first embodiment.

FIG. 1 is a functional block diagram of an antenna device according to a first embodiment. The antenna device 1 is provided with an antenna 10, an output interface 20 for connection to an electronic device on a vehicle side, and a matching circuit 30. The output interface 20 is an interface for connecting the matching circuit 30 electrically connected to the antenna 10 and the electronic device on the vehicle side, and includes a circuit board (with a ground terminal) on which an electronic circuit such as an amplifier circuit is mounted, a cable wiring mechanism for routing to the vehicle side, and an attachment mechanism for attaching to a vehicle. However, the antenna device 1 may be a simple one in which the electronic circuit is omitted.

The matching circuit 30 has a first terminal 301 and a second terminal 302. The first terminal 301 is connected to a feeding portion of the antenna 10 (for example, a base end of an element constituting the antenna 10). The second terminal 302 is connected to an input part of the output interface 20.

To the first terminal 301, one end of both ends of a first matching circuit 31 whose other end is connected to a ground surface of a ground potential (shunt-connected) and one end of both ends of a second matching circuit 32 whose other end is a non-grounded type and is connected in series (series-connected) with the second terminal 302 are connected.

The antenna 10 receives a signal in a predetermined frequency band of the FM waveband that is wider than before due to a linear shape (including a zig-zag shape, a radial shape, and a coil shape), a planar shape (including a plate shape and a bar shape), a meander shape, a fractal shape, or a combination thereof. The predetermined frequency band is a frequency band of from 76 MHz to 108 MHz that includes a frequency band (76 MHz to 95 MHz) used in FM broadcasting in Japan and a frequency band (87.5 MHz to 108 MHz) used in FM broadcasting in countries other than Japan. The antenna 10 may be a dipole type or a monopole type. In the first embodiment, an example of the monopole type is shown for convenience of description.

Figure 2A:
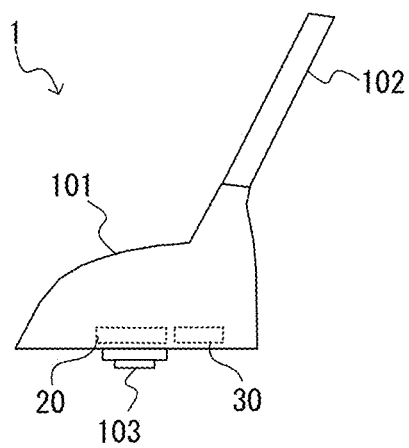
FIG. 2A is an exemplary diagram of a pole antenna.
Figure 2B:
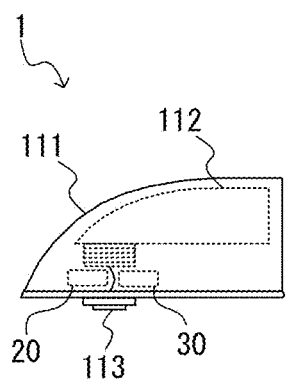
FIG. 2B is an exemplary diagram of an enclosed-type antenna.

In the case of an antenna device for vehicle, antenna components including the antenna 10 are often accommodated in a low-profile antenna case having a height that is equal to or less than the height prescribed by regulations. Examples of an external appearance of the antenna device 1 having the antenna case are schematically shown in FIGS. 2A and 2B. FIG. 2A shows an example of a pole antenna, which is configured by mounting a pole antenna 102 molded with a resin in the vicinity of the top of an antenna case 101 in a detachable or tiltable manner. The pole antenna 102 is, for example, a helical antenna. Inside the antenna case 101, in addition to a matching circuit 30, antenna components of an output interface 20 other than an attachment mechanism 103 to a vehicle are accommodated. The attachment mechanism 103 protrudes from a bottom surface of the antenna case 101. The height from an attachment surface (ground surface) of the vehicle in a case where the antenna device 1 is attached to the vehicle is approximately 200 mm, the impedance at the frequency at which the reactance in the FM waveband is zero is 20 to 50Ω, the capacitance thereat is 2 to 5 pF, and the inductance thereat is less than 1000 nH.

FIG. 2B shows an example of an enclosed-type antenna, in which, for example, inside a shark-fin shaped antenna case 111, an antenna 112 in which a shark fin element in a linear, planar, or meander shape and a coil element are combined, a matching circuit 30, and antenna components of an output interface 20 other than an attachment mechanism 113 to a vehicle are accommodated. In order to distinguish the antenna 112 having such a configuration from the pole antenna 102, the antenna 112 is referred to as an "SF antenna". The attachment mechanism 113 protrudes from a bottom surface of the antenna case 111. The height from an attachment surface of the vehicle (ground surface) to the upper end of the antenna case 111 in a case where the antenna device 1 is attached to the vehicle is approximately 70 mm.

For this reason, the height to the vicinity of the top of the SF antenna 112 accommodated in the antenna case 111 is much lower than the height to the tip of the pole antenna 102. The impedance at the frequency at which the reactance in the FM waveband is zero is 10Ω or less, the capacitance thereat is 2 to 5 pF, and the inductance thereat is less than 1000 nH.

Figure 3:
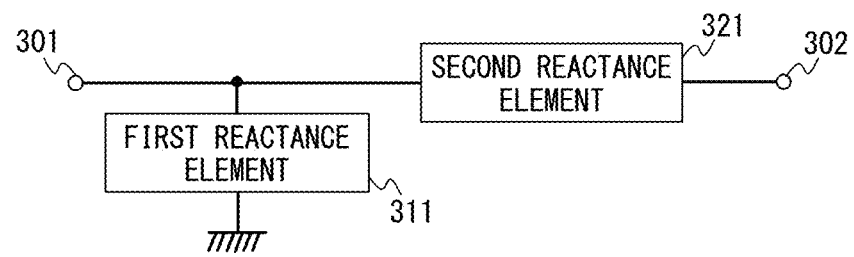
FIG. 3 shows explanatory diagrams in a case where a matching circuit is configured with reactance elements.
Figure 3:
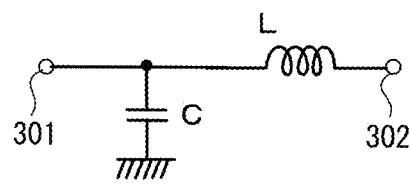
Figure 3:
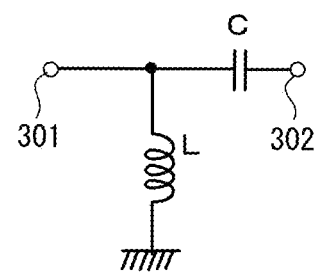

In the simplest example, each of the first matching circuit 31 and the second matching circuit 32 can be configured with a single reactance element, that is, an inductor or a capacitor. FIG. 3 shows an example in which the first matching circuit 31 is configured with a shunt-connected first reactance element 311 and the second matching circuit 32 is configured with a series-connected second reactance element 321. In the present embodiment, the first reactance element 311 and the second reactance element 321 are reactance elements having different polarities from each other. That is, when one of the reactance elements is an inductor L, the other reactance element is a capacitor C as shown in the lower part of FIG. 3 as a CL type and a LC type.

In a case where the second reactance element 321 is the capacitor C as in the LC type, it also serves to cut a direct current from the output interface 20 so as to prevent the direct current from flowing into the matching circuit 30. As a result, an increase in the number of components with which the antenna device 1 is provided can be suppressed.

In the following description, for convenience, a shunt-connected capacitor C, a shunt-connected inductor L, a series-connected inductor L, and a series-connected capacitor C may be referred to as the "shunt C" the "shunt L" the "series L", and the "series C", respectively.

<Operation of Matching Circuits>

Next, an outline of the operation of the matching circuit 30 in the first embodiment will be described. The antenna 10 to which the matching circuit 30 is added is the pole antenna 102 illustrated in FIG. 2A. The state of the impedance of only the pole antenna 102 (provided that it is in a normalized state) is shown in a Smith chart at the top part of FIG. 4.

As is well known, the Smith chart is a plot showing a magnitude of a resistance component R of the impedance (R+(−)jX) as a horizontal axis and a magnitude of a reactance component X as a curve extending radially from the right end of the horizontal axis. The upper side from the center of the horizontal axis represents +j (inductive), and the lower side thereof represents −j (capacitive). The resistance component R is 0 on the left side of the horizontal axis, the resistance component R is 1 at the center portion of the horizontal axis, and the resistance component R and the reactance component X are each infinite at the right end of the horizontal axis.

An arc extending from the right end of the horizontal axis is a part of a perfect circle (a constant reactance circle) representing a magnitude of the reactance component X, and the smaller the diameter thereof, the higher impedance the pole antenna 102 shows. In addition, a circle passing through the horizontal axis is a constant resistance circle and is orthogonal to the constant reactance circle. In a case where the capacitor C and the inductor L are shunt-connected, the impedance moves on a constant conductance circle (a circle in which a magnitude of the real part of the reciprocal of impedance is equal). Further, in the case of the series L, the locus of impedance accompanying a frequency change is clockwise along the constant resistance circle, and in the case of the series C, the locus thereof is counterclockwise.

Here, it is assumed that the pole antenna 102 resonates at 92 MHz and the resistance component R is designed to be 20Ω to 50Ω as described above.

Figure 4:
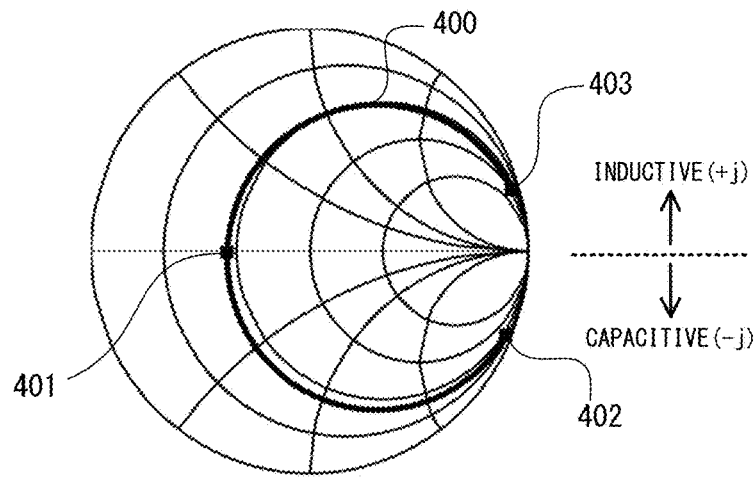
FIG. 4 shows diagrams of a state of an impedance and operating characteristics of only a pole antenna.
Figure 4:
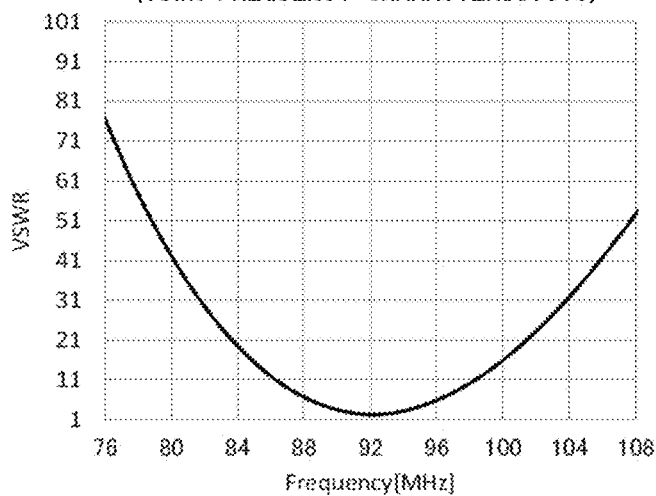
Figure 4:
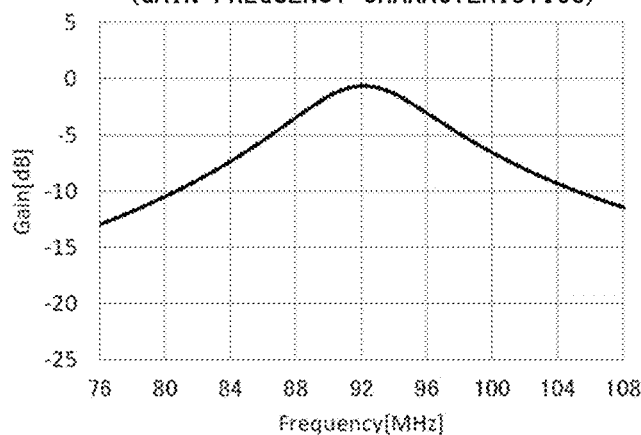

In the Smith chart in the upper part of FIG. 4, 400 denotes a locus of impedance of the pole antenna 102. On the impedance locus 400, 401 denotes an impedance at a resonance point (92 MHz that is the resonance frequency in the present embodiment), 402 denotes an impedance in the low-frequency range that is away from the resonance point in the direction of lower frequencies (a first frequency band: a representative value in the present embodiment is 76 MHz), and 403 denotes an impedance in the high-frequency range that is away therefrom in the direction of higher frequencies (a second frequency band: a representative value in the present embodiment is 108 MHz).

In the following description, the impedance 401 at 92 MHz and in the vicinity thereof may be referred to as the "resonance point impedance", the impedance 402 in the low-frequency range including 76 MHz may be referred to as the "low-frequency range impedance", and the impedance 403 in the high-frequency range including 108 MHz may be referred to as the "high-frequency range impedance". As shown in the Smith chart, the pole antenna 102 has an impedance that is capacitive in the low-frequency range and inductive in the high-frequency range of the entire frequency band.

The middle part of FIG. 4 is a VSWR-frequency characteristic diagram of the pole antenna 102 before the matching circuit 30 is added, and the lower part of FIG. 4 is a gain-frequency characteristic diagram of the pole antenna 102. Each of the horizontal axes is a frequency (MHz). In a case where the VSWR-frequency characteristic and the gain-frequency characteristic are generically referred, or when an impedance state is included in the VSWR-frequency characteristic and the gain-frequency characteristic, they are described as "operating characteristics".

According to the operating characteristics shown in FIG. 4, viewed from the entire frequency band of from 76 MHz to 108 MHz, the maximum value of the VSWR is 76.58 and the minimum value thereof is 2.20, and the difference between the maximum value and the minimum value (hereinafter, referred to as the deviation) is 74.38. In addition, the maximum value of the gain is −0.66 dB, the minimum value thereof is −12.9 dB, and the deviation therebetween is 12.28 dB. The deviations in the VSWR and the gain are large as described above because the antenna device 1 for vehicle uses an antenna of a resonance type (for example, the pole antenna 102) and configures the antenna in a limited range, which results in the inductance larger than the capacitance. It is also noted that the height of the antenna 10 from the ground surface is extremely low and the radiation resistance is not sufficient as compared with the resonance wavelength of the frequency mainly used in the FM waveband, therefore, this may cause the deviations in the VSWR and the gain to be large.

The conventional matching circuits disclosed in Patent Literatures 1, 2, and 3 aim at widening the bandwidth by improving the VSWR and the gain at approximately 10 MHz before and after the resonance point to a practical level under the above-described size restrictions, not from a perspective of reducing the deviations of the VSWR and the gain in the entire frequency band including a low-frequency range such as 76 MHz or a high-frequency range such as 108 MHz. This will be described later by using Comparative Examples 1 to 5.

In the antenna device 1 of the present embodiment, in the matching circuit 30, as shown in FIGS. 1 and 3, the first matching circuit 31 (the first reactance element 311) is shunt-connected and the second matching circuit 32 (the second reactance element 321) is series-connected. Then, the first matching circuit 31 reduces an impedance in the high-frequency range away in a higher direction from the vicinity of the resonance point of the pole antenna 102 or in the low-frequency range away in a lower direction therefrom such that the impedance is lower than before the first matching circuit 31 is connected.

In addition, the second matching circuit 32 increases an impedance in the vicinity of the resonance point such that the impedance is higher than before the second matching circuit 32 is connected while maintaining a state in which the impedances in the high-frequency range and the low-frequency range are low. As a result, it is possible to reduce the deviation of the VSWR and the deviation of the gain in the entire frequency band from the low-frequency range to the high-frequency range.

Figure 5:
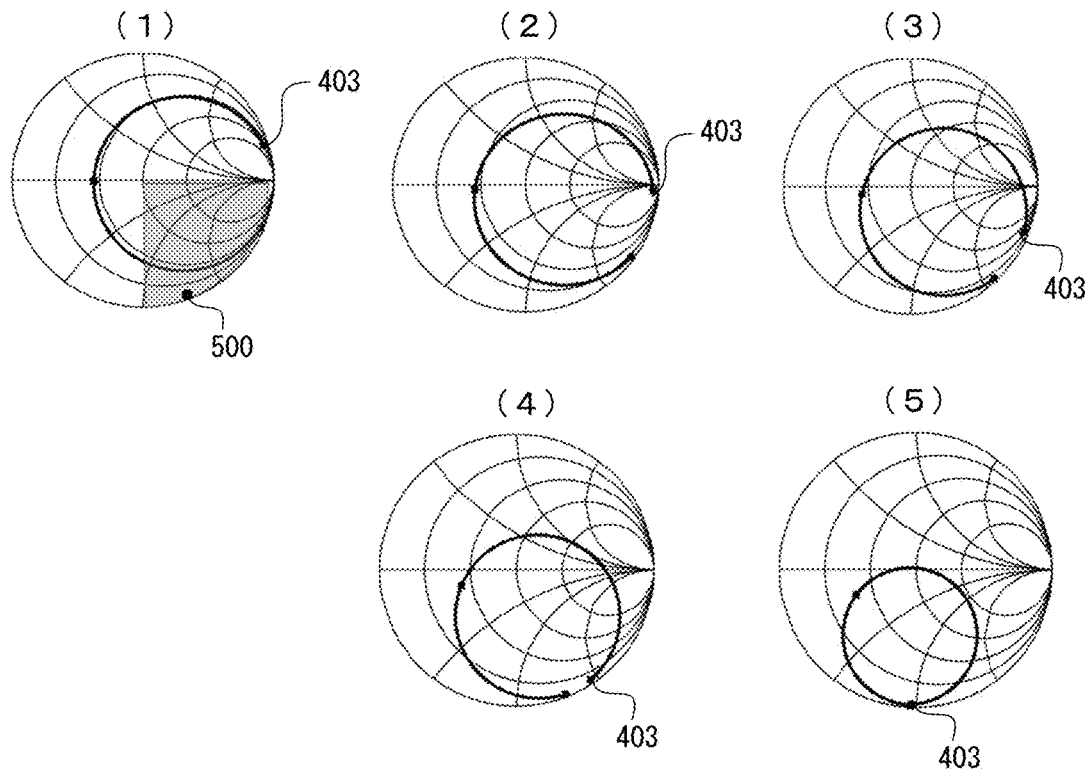
FIG. 5 shows Smith charts of changing states of an impedance in a case where a shunt C is used.

The states of the impedance of the first terminal 301, in a case where the first matching circuit 31 is the shunt C with only the shunt C being connected and a magnitude of the capacitance is changed, are represented by the Smith charts of FIG. 5 (1)~FIG. 5 (5). FIG. 5 (1) shows a state of the impedance of only the pole antenna 102, which is the same as the upper part of FIG. 4. The shunt C causes the high-frequency range impedance 403 to move to a fourth quadrant 500 of the Smith chart (a lower half region of a constant resistance circle that passes through the center (1, 0) of the horizontal axis). As a result, when the second matching circuit 32 is connected, it is possible to lower the impedances in the high-frequency range and the low-frequency range and to increase the impedance in the vicinity of the resonance point.

FIG. 5 (2) shows the locus of impedance of the pole antenna 102 in a case where the capacitance is 5 pF. Similarly, FIG. 5 (3), FIG. 5 (4), and FIG. 5 (5) each shows the locus of impedance of the pole antenna 102 in a case where the capacitance is 10 pF, 20 pF, and 35 pF, respectively. As shown, the high-frequency range impedance 403 moves toward the fourth quadrant 500 of the Smith chart as the capacitance increases. In practice, there may an influence of the inductance, but in either case, with a capacitance having a magnitude that allows deviation from the fourth quadrant 500 of the Smith chart, the VSWR does not decrease even when the second matching circuit 32 is connected.

Figure 6:
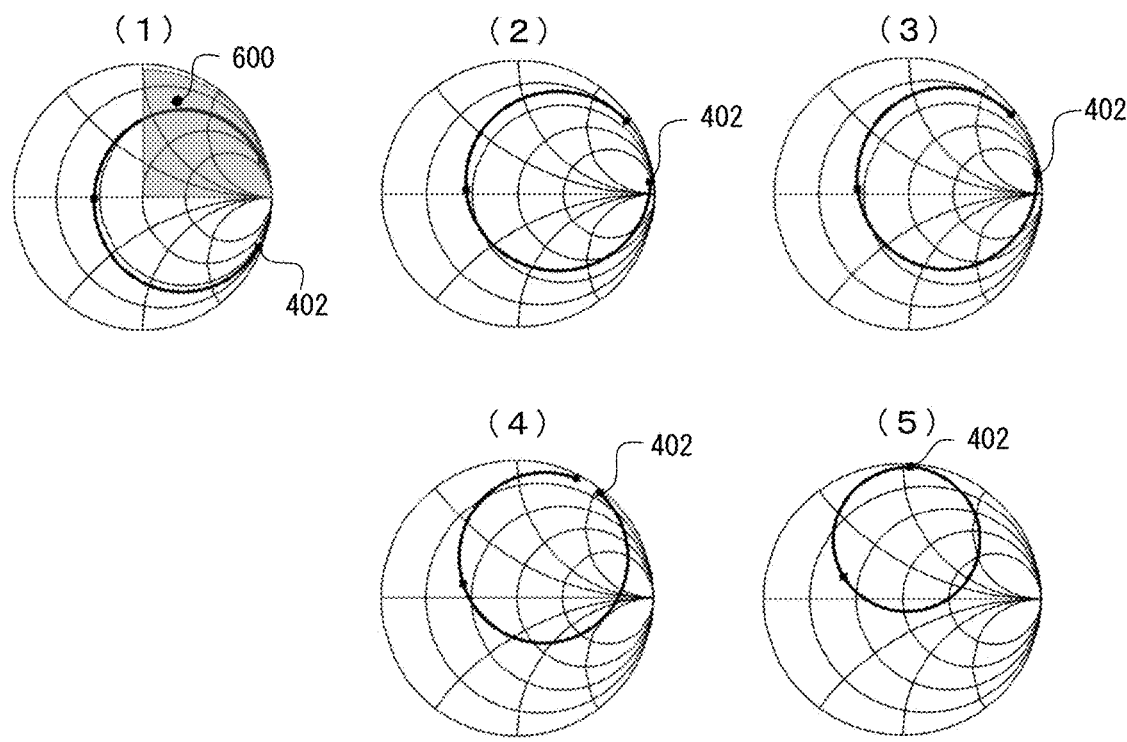
FIG. 6 shows Smith charts of changing states of an impedance in a case where a shunt L is used.

The states of the impedance of the pole antenna 102 in a case where the first matching circuit 31 is the shunt L and the inductance of the shunt L is changed are represented by the Smith charts of FIG. 6 (1)~FIG. 6 (5).

FIG. 6 (1) shows a state of the impedance of only the pole antenna 102, which is the same as the upper part of FIG. 4. The shunt L causes the low-frequency range impedance 402 to move to a first quadrant 600 of the Smith chart (an upper half region of a constant resistance circle that passes through the center (1, 0) of the horizontal axis) of FIG. 6 (1). As a result, when the second matching circuit 32 is connected, it is possible to lower the impedances in the high-frequency range and the low frequency-range and to increase the impedance in the vicinity of the resonance point. FIG. 6 (2) shows the locus of impedance in a case where the inductance is 400 nH. Similarly, FIG. 6 (3), FIG. 6 (4), and FIG. 6 (5) each shows the locus of impedance in a case where the inductance is 350 nH, 150 nH, and 90 nH, respectively.

As shown, the low-frequency range impedance 402 moves toward the first quadrant 600 of the Smith chart as the inductance decreases. In practice, there may be an influence by the capacitance, but in either case, with an impedance having a magnitude that allows deviation from the first quadrant 600 of the Smith chart, the VSWR does not decrease even when the second matching circuit 32 is connected.

Hereinafter, the state of the impedance and the operating characteristics of the pole antenna 102 according to an aspect of connection of the capacitor C and the inductor L in the matching circuit 30 will be specifically described.

(1-1) Shunt C+Series L

Figure 7:
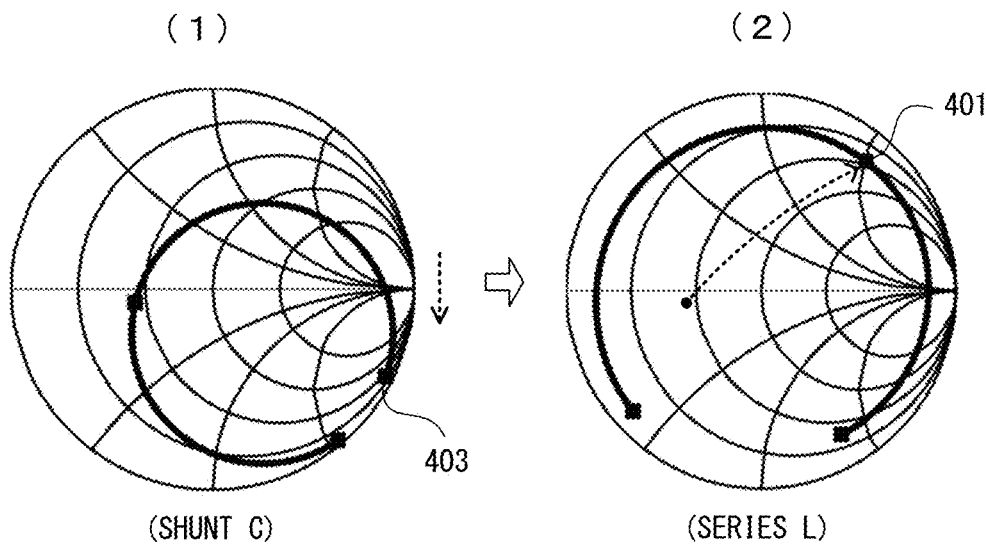
FIG. 7 shows diagrams of states of an impedance and operating characteristics by the shunt C and a series L.
Figure 7:
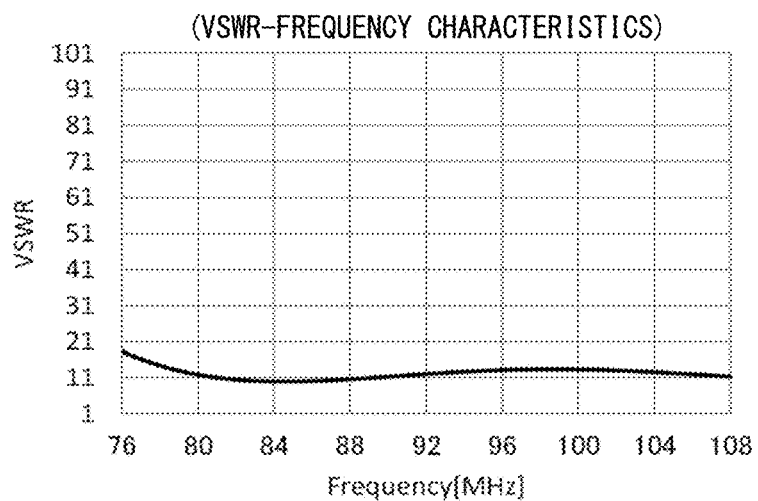
Figure 7:
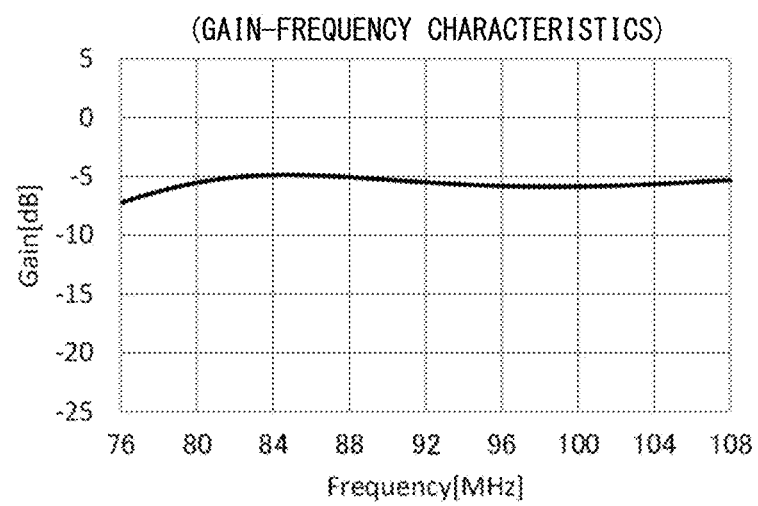

FIG. 7 shows diagrams showing an example of operating characteristics in a case where the matching circuit 30 is configured with the shunt C and the series L. As shown in (1) in the upper part of FIG. 7, the shunt C causes the high-frequency range impedance 403 to move to be more capacitive on the Smith chart (marked by a broken line arrow). That is, the high-frequency range impedance 403 moves toward the fourth quadrant 500 of the Smith chart shown in FIG. 5 (1). In addition, as shown in (2) in the upper part of FIG. 7, the series L causes the resonance point impedance 401 to move to the high impedance side (marked by a broken line arrow).

The VSWR-frequency characteristic diagram of this case is shown in the middle part of FIG. 7, and the gain-frequency characteristic diagram thereof is shown in the lower part of FIG. 7. Viewed from the entire frequency band of from 76

MHz to 108 MHz that is the focus of attention in the first embodiment, the maximum value of the VSWR is 18.3, the minimum value thereof is 9.9, and the deviation therebetween is 8.4. In addition, the maximum value of the gain is −4.9 dB, the minimum value thereof is −7.2 dB, and the deviation therebetween is 2.4 dB.

As compared with the case of only the pole antenna 102 (see the respective characteristic diagrams of FIG. 4), the deviation of the VSWR is reduced from 74.38 to 8.4, and the deviation of the gain is also reduced from 12.28 dB to 2.4 dB.

The lowered gain can be easily compensated with an amplifier circuit (not shown). For this reason, with one pole antenna 102, it is possible to receive not only the frequency band (76 MHz to 95 MHz) used in FM broadcasting in Japan but also the frequency band (87.5 MHz to 108 MHz) used in FM broadcasting in countries other than Japan, thereby making it possible to achieve the antenna device 1 suitable for mass production.

(1-2) Shunt L+Series C

Figure 8:
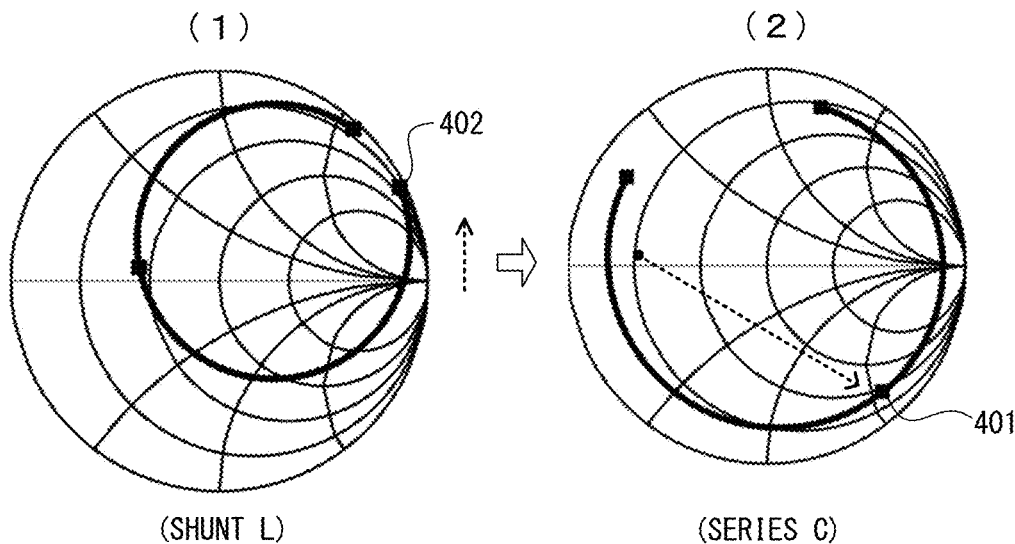
FIG. 8 shows diagrams of states of an impedance and operating characteristics by the shunt L and a series C.
Figure 8:
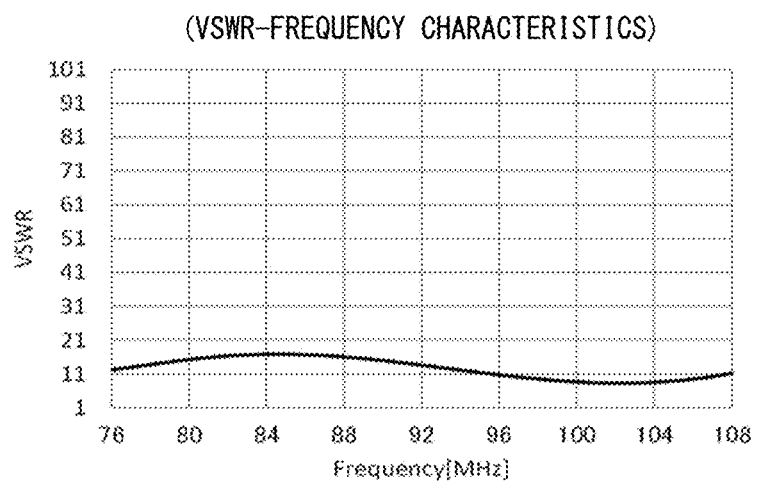
Figure 8:
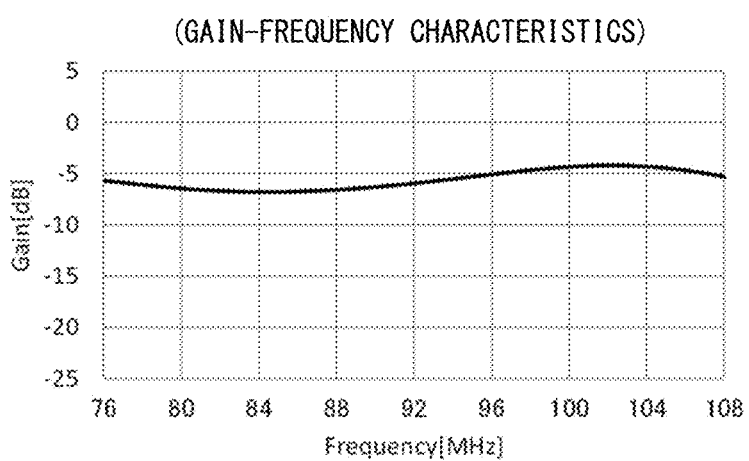

FIG. 8 shows diagrams showing an example of operating characteristics in a case where the matching circuit 30 is configured with the shunt L and the series C. As shown in (1) in the upper part of FIG. 8, the shunt L causes the low-frequency range impedance 402 to move to the inductive area on the Smith chart (marked by a broken line arrow). That is, the low-frequency range impedance 402 moves toward the first quadrant 600 of the Smith chart shown in FIG. 6 (1). In addition, as shown in (2) in the upper part of FIG. 8, the series C causes the resonance point impedance 401 to move to the high impedance side on the Smith chart (marked by a broken line arrow).

The VSWR-frequency characteristic diagram of this case is shown in the middle part of FIG. 8, and the gain-frequency characteristic diagram thereof is shown in the lower part of FIG. 8. Viewed from the entire frequency band of from 76 MHz to 108 MHz, the maximum value of the VSWR is 16.8, the minimum value thereof is 8.3, and the deviation therebetween is 8.6. In addition, the maximum value of the gain is −4.2 dB, the minimum value thereof is −6.8 dB, and the deviation therebetween is 2.6 dB. As compared with the case of only the pole antenna 102 (see the respective characteristic diagrams of FIG. 4), the deviation of the VSWR is reduced from 74.38 to 8.6, and the deviation of the gain is reduced from 12.28 dB to 2.6 dB. The lowered gain can be easily compensated with an amplifier circuit (not shown).

For this reason, with one pole antenna 102, it is possible to receive not only the frequency band used in FM broadcasting in Japan (76 MHz to 95 MHz) but also the frequency band used in FM broadcasting in countries other than Japan (87.5 MHz to 108 MHz), thereby making it possible to achieve the antenna device 1 suitable for mass production.

Comparative Examples

Here, for comparison with the matching circuit 30, a number of matching circuits in which aspects of connection of the inductor L and the capacitor C are different from that of the matching circuit 30 will be described as comparative examples.

Figure 9:
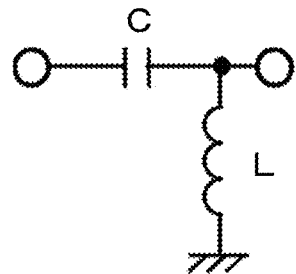
FIG. 9 shows diagrams describing connection states in Comparative Examples 1 to 5.
Figure 9:
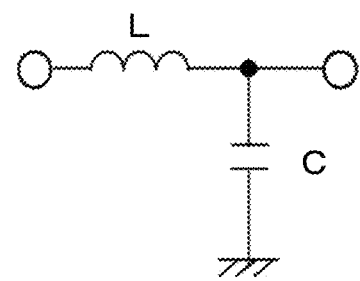
Figure 9:
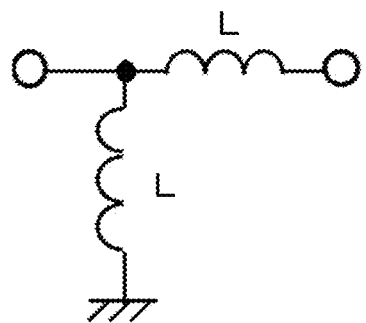
Figure 9:
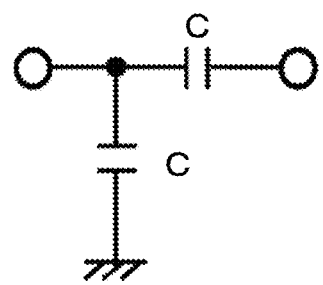
Figure 9:
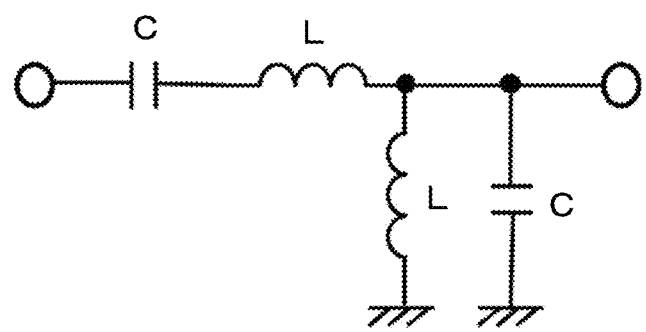

FIG. 9 shows configuration diagrams of Comparative Example 1 to Comparative Example 5. Comparative Example 1 is configured with the series C and the shunt L. Comparative Example 2 is configured with the series L and the shunt C. Comparative Example 3 is configured with the shunt L and the series L. Comparative Example 4 is configured with the shunt C and the series C. Comparative Example 5 is configured with the series C, the series L, the shunt L, and the shunt C. Comparative Example 5 described above is a matching circuit disclosed in Patent Literature 1 that is cited as an example of the prior art. The pole antenna 102 having the operating characteristics described in FIG. 4 is connected to the left terminal of the matching circuit, and the output interface 30 is connected to the right terminal thereof.

(1-3) Comparative Example 1 (Series C+Shunt L)

The operating characteristics of Comparative Example 1 will be described with reference to FIG. 10. In this matching circuit, as shown in (1) in the upper part of FIG. 10, the series C causes the resonance point impedance 401 to move counterclockwise on the Smith chart (marked by a broken line arrow). In addition, as shown in (2) in the upper part of FIG. 10, the shunt L causes the low-frequency range impedance 402 to move to be more inductive on the Smith chart (marked by a broken line arrow). At that time, depending on the frequency, the impedance becomes low through the inductor L of the shunt L.

Figure 10:
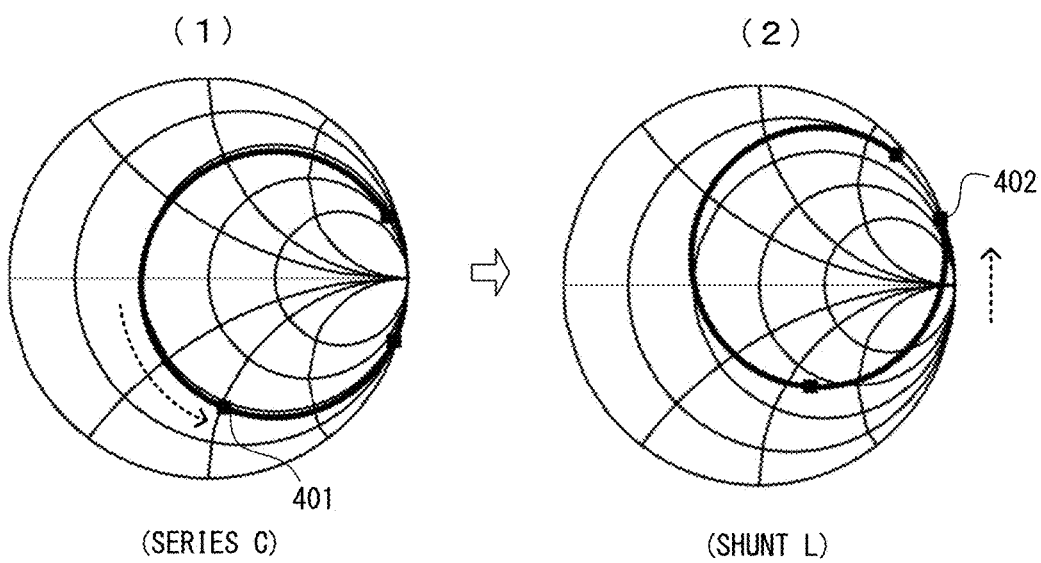
FIG. 10 shows diagrams of states of an impedance and operating characteristics by Comparative Example 1.
Figure 10:
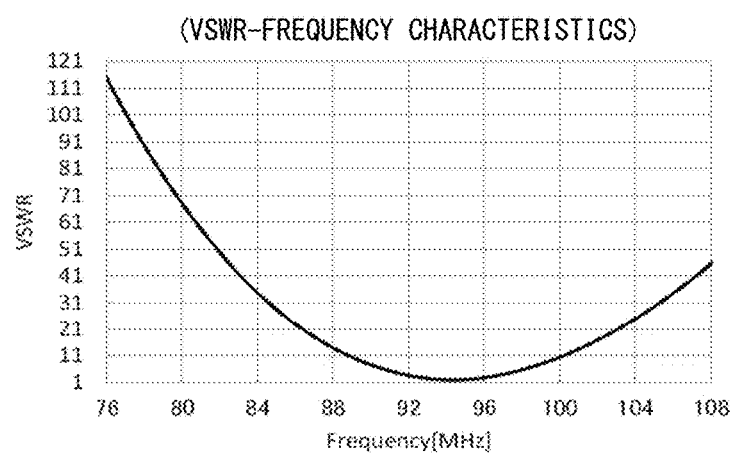
Figure 10:
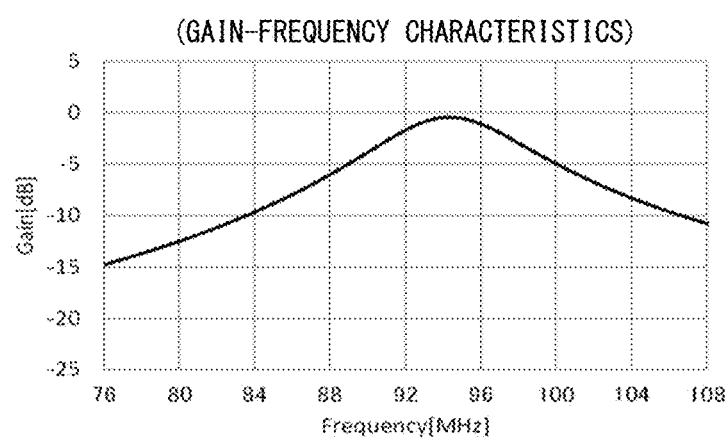

The VSWR-frequency characteristic diagram of this case is shown in the middle part of FIG. 10, and the gain-frequency characteristic diagram thereof is shown in the lower part of FIG. 10. Viewed from the entire frequency band of from 76 MHz to 108 MHz, the maximum value of the VSWR is 114.9, the minimum value thereof is 1.9, and the deviation therebetween is 113.0. In addition, the maximum value of the gain is −0.5 dB, the minimum value thereof is −14.8 dB, and the deviation therebetween is 14.3 dB.

As described above, the matching circuit of Comparative Example 1 is of a different concept from the matching circuit 30, and neither the deviation of the VSWR nor the deviation of the gain is reduced.

(1-4) Comparative Example 2 (Series L+Shunt C)

The operating characteristics of Comparative Example 2 will be described with reference to FIG. 11. In this matching circuit, as shown in (1) in the upper part of FIG. 11, the series L causes the resonance point impedance 401 to move clockwise on the Smith chart (marked by a broken line arrow). In addition, as shown in (2) in the upper part of FIG. 11, the shunt C causes the high-frequency range impedance 403 to move to be more capacitive on the Smith chart (marked by a broken line arrow). At that time, depending on the frequency, the impedance becomes low through the capacitance of the shunt C.

Figure 11:
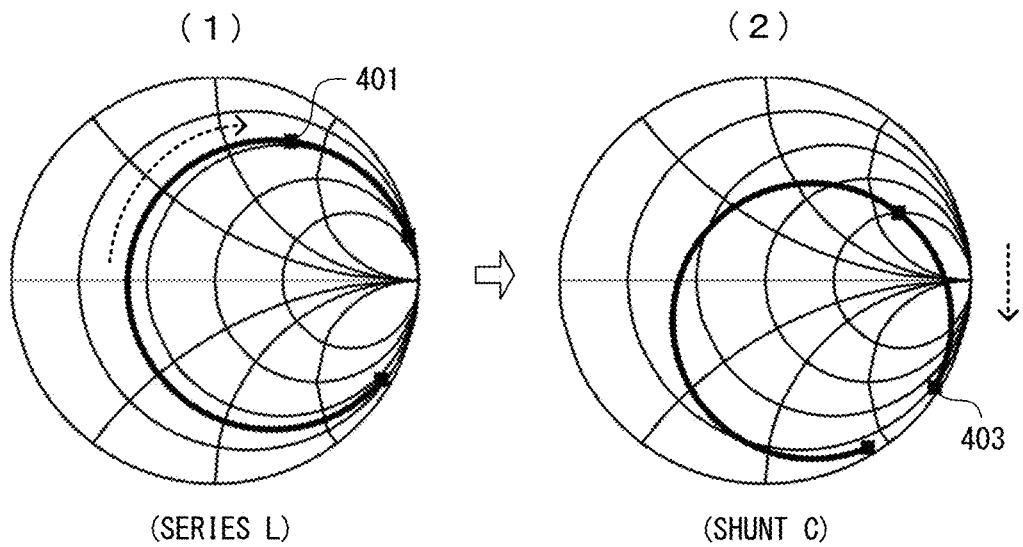
FIG. 11 shows diagrams of states of an impedance and operating characteristics by Comparative Example 2.
Figure 11:
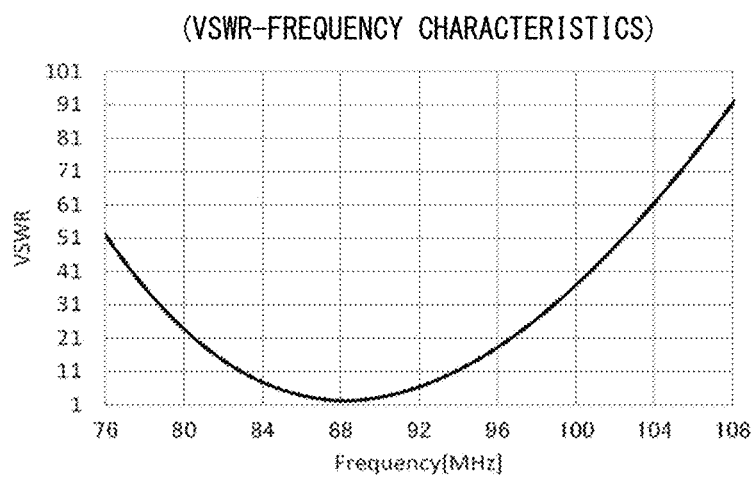
Figure 11:
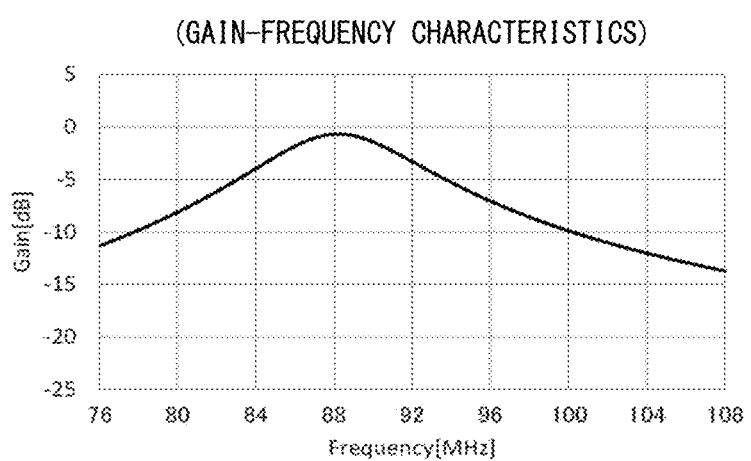

The VSWR-frequency characteristic diagram of this case is shown in the middle part of FIG. 11, and the gain-frequency characteristic diagram thereof is shown in the lower part of FIG. 11. Viewed from the entire frequency band of from 76 MHz to 108 MHz, the maximum value of the VSWR is 91.4, the minimum value thereof is 2.2, and the deviation therebetween is 89.2. The maximum value of the gain is −0.7 dB, the minimum value thereof is −13.7 dB, and the deviation therebetween is 13.0 dB. As described above, the matching circuit of Comparative Example 2 is also of a different concept from the matching circuit 30, and neither the deviation of the VSWR nor the deviation of the gain is reduced.

(1-5) Comparative Example 3 (Shunt L+Series L)

The operating characteristics of Comparative Example 3 will be described with reference to FIG. 12. In this matching circuit, as shown in (1) in the upper part of FIG. 12, the shunt L causes the low-frequency range impedance 402 to move to be more inductive on the Smith chart (marked by a broken line arrow). In addition, as shown in (2) in the upper part of FIG. 12, the series L causes the resonance point impedance 401 to move clockwise on the Smith chart (marked by a broken line arrow). That is, the impedance merely becomes high in the entire frequency band.

Figure 12:
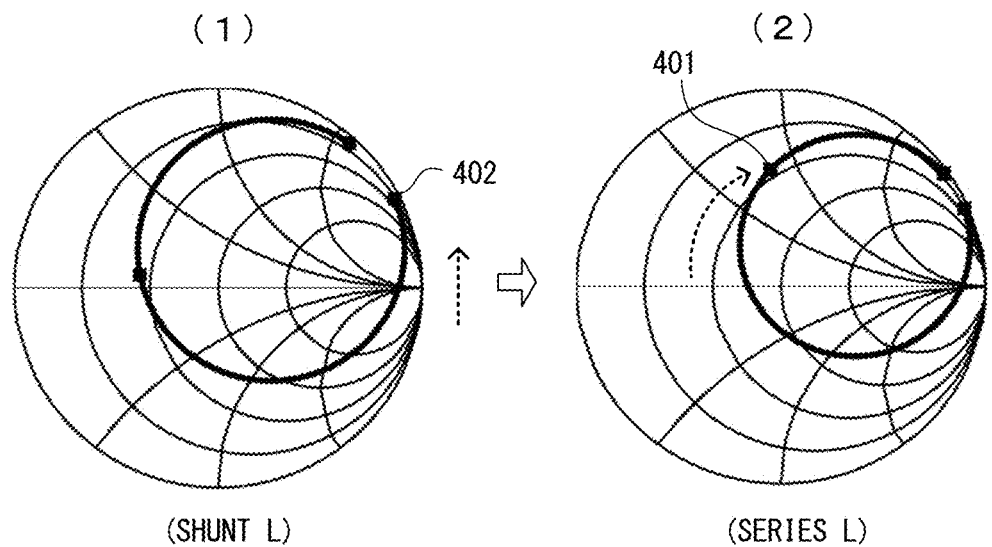
FIG. 12 shows diagrams of states of an impedance and operating characteristics by Comparative Example 3.
Figure 12:
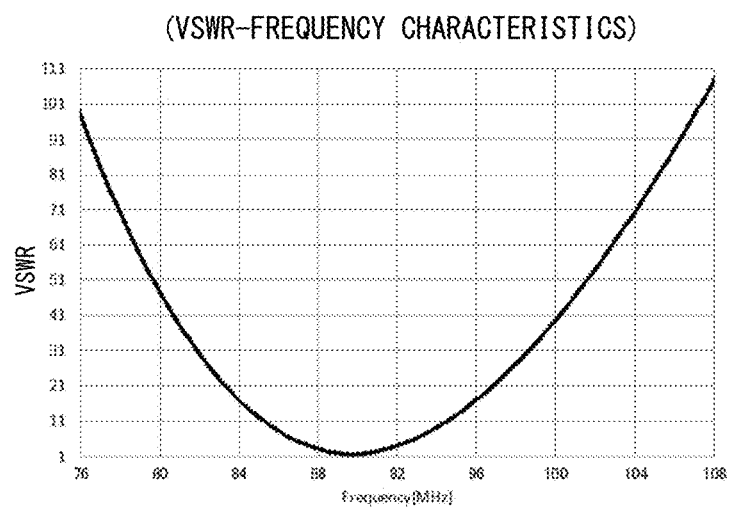
Figure 12:
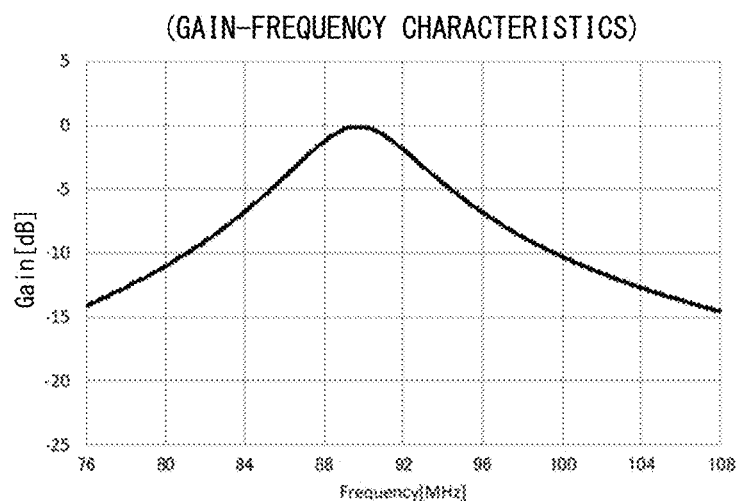

The VSWR-frequency characteristic diagram of this case is shown in the middle part of FIG. 12. In addition, the gain-frequency characteristic diagram thereof is shown in the lower part of FIG. 12. Viewed from the entire frequency band of from 76 MHz to 108 MHz, the maximum value of the VSWR is 107.8, the minimum value thereof is 1.3, and the deviation therebetween is 106.5. The maximum value of the gain is −0.1 dB, the minimum value thereof is −14.5 dB, and the deviation therebetween is 14.4 dB. As described above, in Comparative Example 3, though the first reactance element of FIG. 3 is shunt-connected and the second reactance element thereof is series-connected, the polarities of the respective reactance elements are the same. For this reason, the impedance merely becomes high in the entire frequency band.

That is, the matching circuit of Comparative Example 3 is also of a different concept from the matching circuit 30, and neither the deviation of the VSWR nor the deviation of the gain is reduced.

(1-6) Comparative Example 4 (Shunt C+Series C)

The operating characteristics of Comparative Example 4 will be described with reference to FIG. 13. In this matching circuit, as shown in (1) in the upper part of FIG. 13, the shunt C causes the high-frequency range impedance 403 to move to be more capacitive on the Smith chart (marked by a broken line arrow). In addition, as shown in (2) in the upper part of FIG. 13, the series C causes the resonance point impedance 401 to move counterclockwise on the Smith chart (marked by a broken line arrow). That is, the impedance merely becomes high in the entire frequency band.

Figure 13:
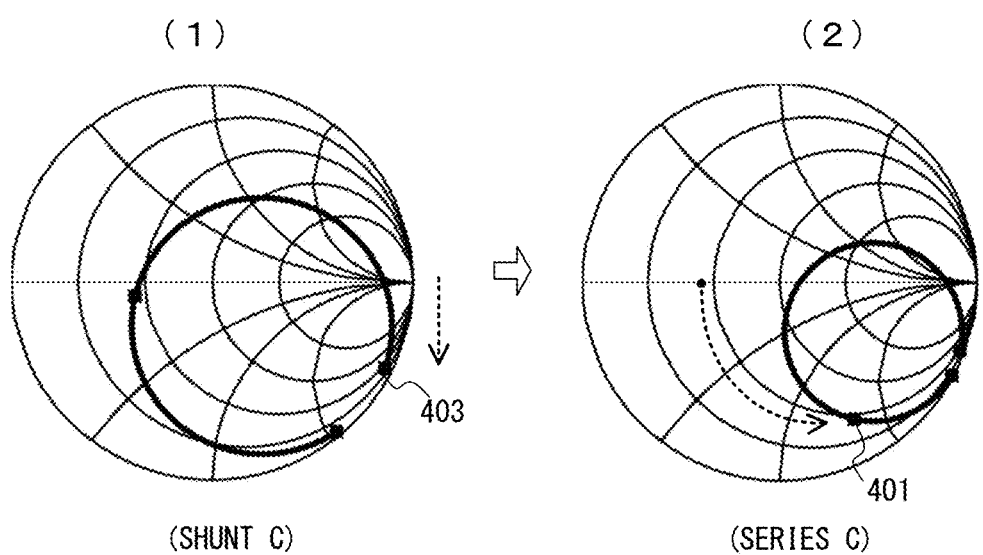
FIG. 13 shows diagrams of states of an impedance and operating characteristics by Comparative Example 4.
Figure 13:
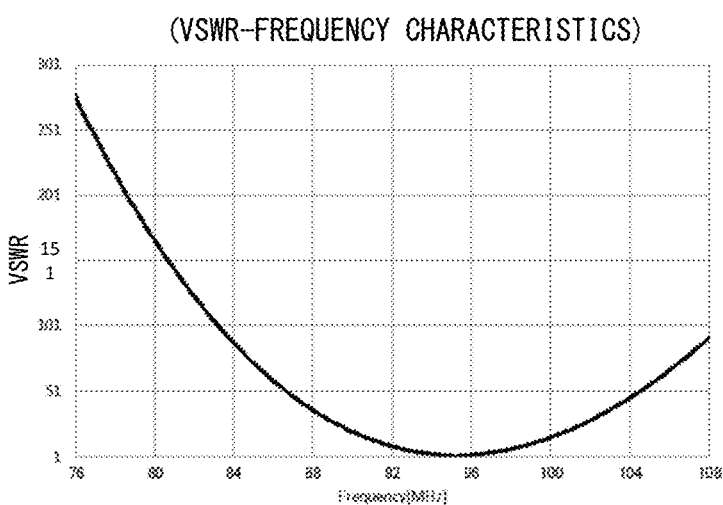
Figure 13:
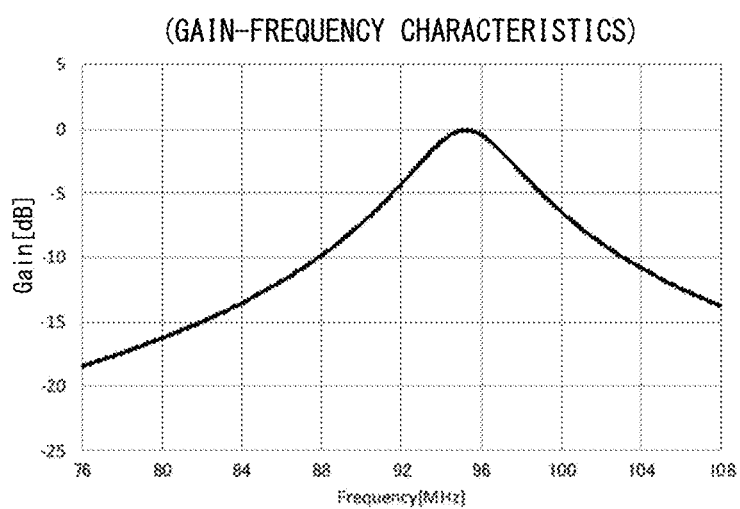

The VSWR-frequency characteristic diagram of this case is shown in the middle part of FIG. 13. In addition, the gain-frequency characteristic diagram thereof is shown in the lower part of FIG. 14. Viewed from the entire frequency band of from 76 MHz to 108 MHz, the maximum value of the VSWR is 275.3, the minimum value thereof is 1.2, and the deviation therebetween is 274.2. The maximum value of the gain is −0.0 dB, the minimum value thereof is −18.4 dB, and the deviation therebetween is 18.4 dB.

As described above, in the matching circuit according to Comparative Example 4, in a similar manner to the matching circuit according to Comparative Example 3, since the polarities of the respective reactance elements are the same, the impedance merely becomes high in the entire frequency band. That is, the matching circuit of Comparative Example 4 is also of a different concept from the matching circuit 30, and neither the deviation of the VSWR nor the deviation of the gain is reduced.

(1-7) Comparative Example 5 (Series C+Series L+Shunt L+Shunt C)

The operating characteristics of Comparative Example 5 will be described with reference to FIG. 14. In this matching circuit, as shown in (1) in the upper part of FIG. 14, the series C causes the resonance point impedance 401 to move counterclockwise on the Smith chart (marked by a broken line arrow). In addition, as shown in (2) in the upper part of FIG. 14, the series L causes the resonance point impedance 401 to move clockwise on the Smith chart (marked by a broken line arrow). In addition, as shown in (3) in the upper part of FIG. 14, the shunt L causes the low-frequency range impedance 402 to move to be more inductive on the Smith chart (marked by a broken line arrow). However, as shown in (4) in the upper part of FIG. 14, the shunt C causes the high-frequency range impedance 403 (the same applies to the low-frequency range impedance 402) to move to be more capacitive (marked by a broken line arrow). For this reason, the result is the same as before the matching circuit is added.

Figure 14:
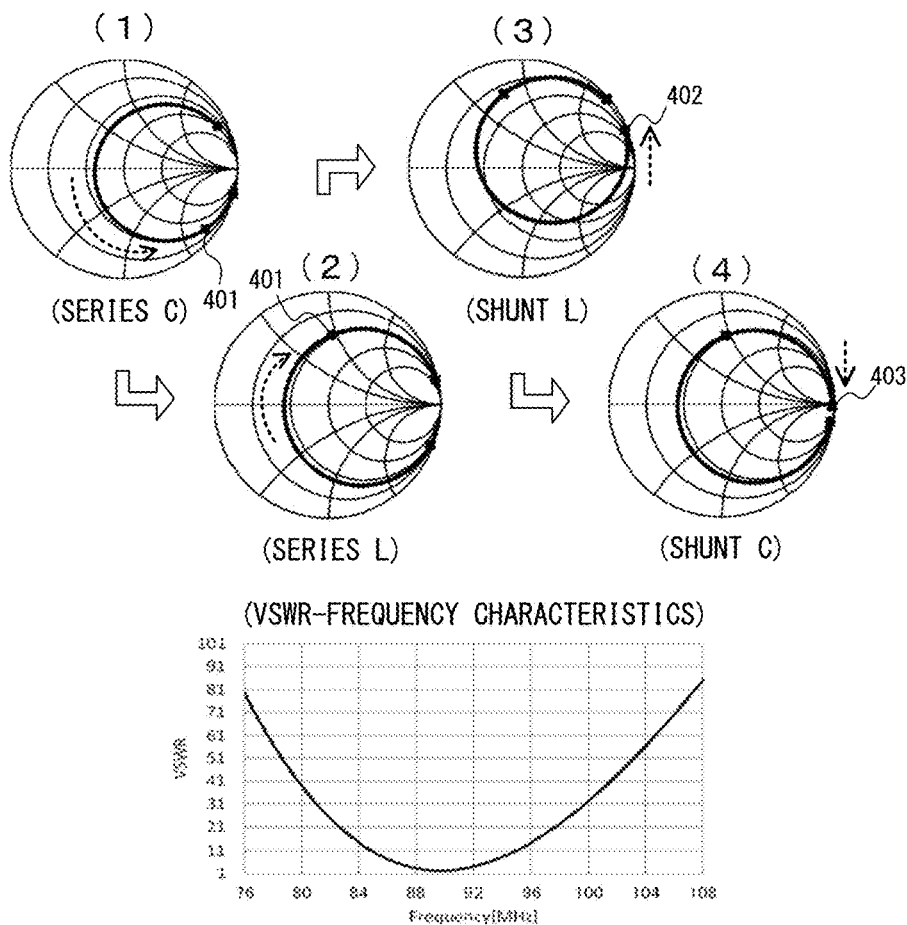
FIG. 14 shows diagrams of states of an impedance and operating characteristics by Comparative Example 5.
Figure 14:
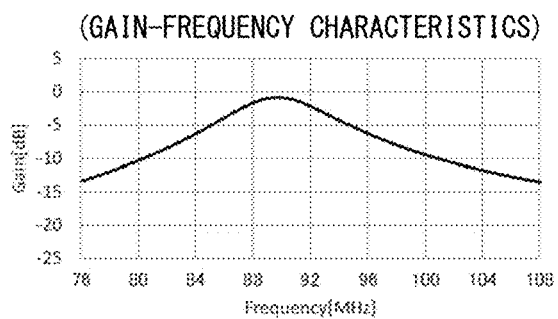

The VSWR-frequency characteristic diagram of this case is shown in the middle part of FIG. 14. In addition, the gain-frequency characteristic diagram thereof is shown in the lower part of FIG. 14. Viewed from the entire frequency band of from 76 MHz to 108 MHz, the maximum value of the VSWR is 85.0, the minimum value thereof is 2.3, and the deviation therebetween is 82.8. The maximum value of the gain is 4.9 dB, the minimum value thereof is −13.5 dB, and the deviation therebetween is 12.7 dB. That is, the matching circuit according to Comparative Example 5 (an example of the prior art) is also of a different concept from the matching circuit 30, and neither the deviation of the VSWR nor the deviation of the gain is reduced.

As described above, in a case where the matching circuit according to Comparative Examples 1 to 5 is added to the pole antenna 102, the deviation of the gain of the pole antenna 102 is 12.7 dB or more in the entire frequency band of from 76 MHz to 108 MHz. Therefore, there is a limit to widening of the bandwidth. For this reason, when an amplifier circuit for amplifying a received signal is mounted at a subsequent stage of each matching circuit, it is necessary to separately mount one for the vicinity of the resonance point, one for the low-frequency range and the vicinity of the resonance point, and one for the vicinity of the resonance point and the high-frequency range.

On the other hand, in the matching circuit 30 of the first embodiment, as the deviation of the VSWR is reduced and the deviation of the gain can also be reduced to as small as 10.0 dB or less, only one amplifier circuit at the subsequent stage is sufficient.

Second Embodiment

Figure 15:
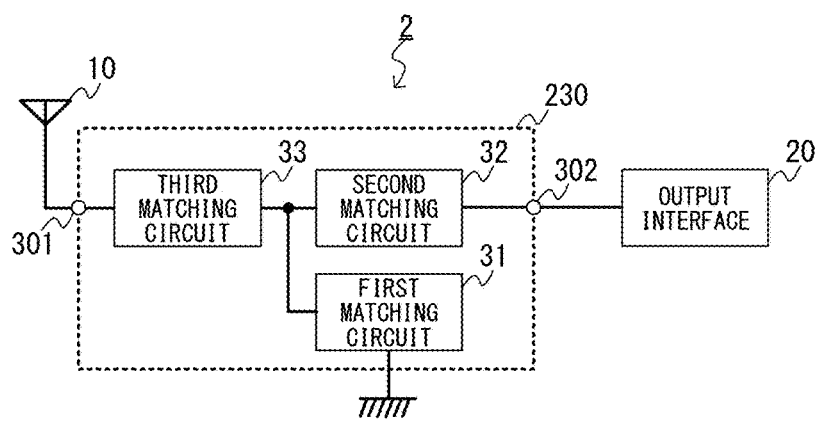
FIG. 15 is a function configuration diagram of an antenna device according to a second embodiment.

Next, a second embodiment of the present invention will be described. FIG. 15 is a functional block diagram of an antenna device 2 according to the second embodiment. The antenna device 2 is different from the antenna device 1 of the first embodiment only in that the configuration of a matching circuit 230 is different from that of the matching circuit 30. The matching circuit 230 of the second embodiment includes a third matching circuit 33 of a non-grounded type connected between the pole antenna 102 and a preceding stage of the first matching circuit 31.

Figure 16:
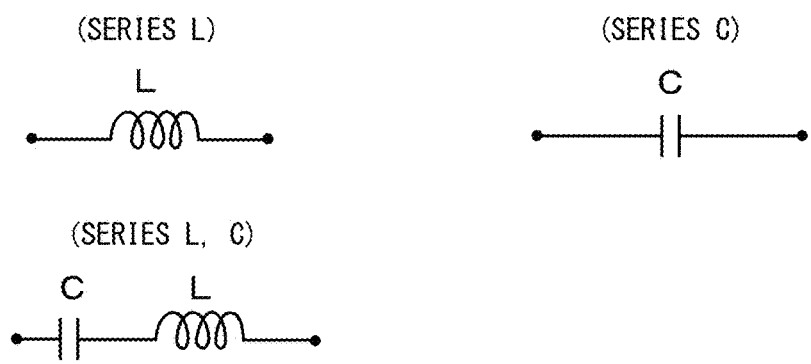
FIG. 16 shows diagrams of examples of configuration of a third matching circuit.

In a simple circuit example, as shown in FIG. 16, only an inductor L, only a capacitor C, or a capacitor C and an inductor L that are connected in series can be used as the third matching circuit 33. Other configurations of the antenna device 2 and the matching circuit 230 are the same as those of the antenna device 1 and the matching circuit 30 of the first embodiment.

Hereinafter, the operating characteristics of the pole antenna 102 according to an aspect of connection of the capacitor C and the inductor L in the matching circuit 230 will be specifically described.

(2-1) Series L+Shunt C+Series L

Figure 17:
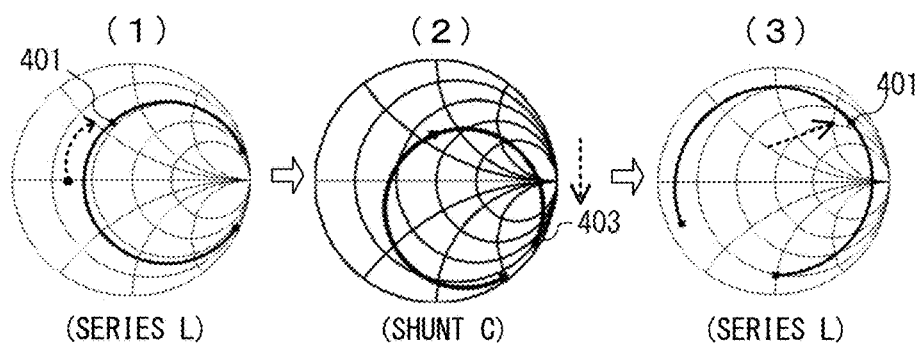
FIG. 17 shows diagrams of states of an impedance and operating characteristics by a matching circuit configured with the series L, the shunt C, and the series L.
Figure 17:
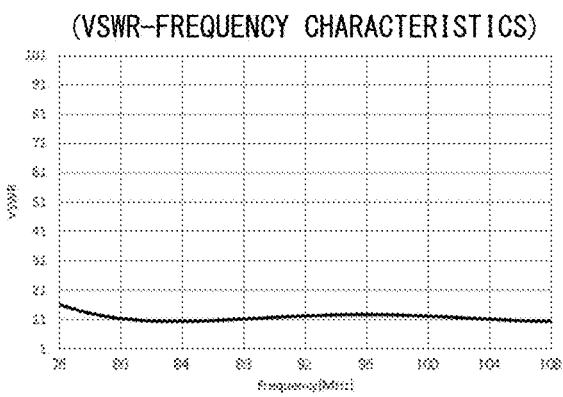
Figure 17:
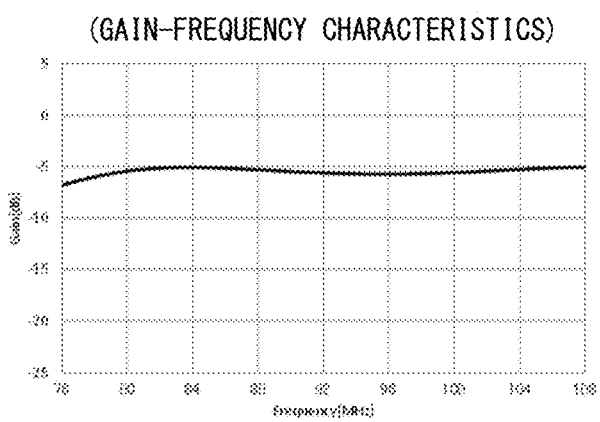

FIG. 17 shows diagrams showing the operating characteristics in a case where the matching circuit 230 is configured with the series L, the shunt C, and the series L. In this matching circuit 230, as shown in (1) in the upper part of FIG. 17, the series L causes the resonance point impedance 401 to move clockwise on the Smith chart (marked by a broken line arrow). In addition, as shown in (2) in the upper part of FIG. 17, the shunt C causes the high-frequency range impedance 403 to move to be more capacitive on the Smith chart (marked by a broken line arrow). Further, as shown in FIG. 17 (3), the series L causes the resonance point impedance 401 to move to the high impedance side (marked by a broken line arrow).

The VSWR-frequency characteristic diagram of this case is shown in the middle part of FIG. 17, and the gain-frequency characteristic diagram thereof is shown in the lower part of FIG. 17. Viewed from the entire frequency band of from 76 MHz to 108 MHz, the maximum value of the VSWR is 16.2, the minimum value thereof is 10.4, and the deviation therebetween is 5.8. In addition, the maximum value of the gain is −5.0 dB, the minimum value thereof is −6.8 dB, and the deviation therebetween is 1.7 dB. For this reason, in a similar manner to the matching circuit 30 of the first embodiment, the deviation of the VSWR and the deviation of the gain are reduced, which allows the pole antenna 102 to operate over the entire frequency band in a stable manner.

(2-2) Series C+Shunt L+Series C

Figure 18:
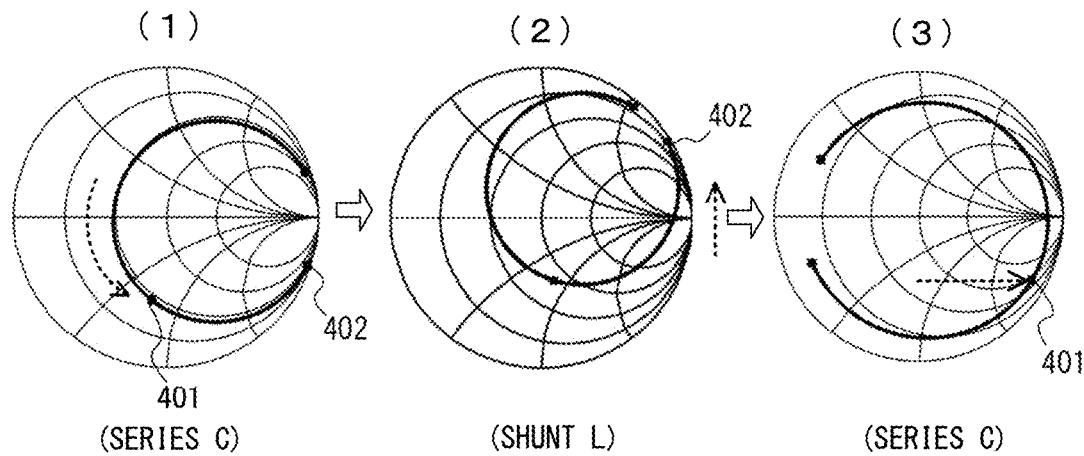
FIG. 18 shows diagrams of states of an impedance and operating characteristics by a matching circuit configured with the series C, the shunt L, and the series C.
Figure 18:
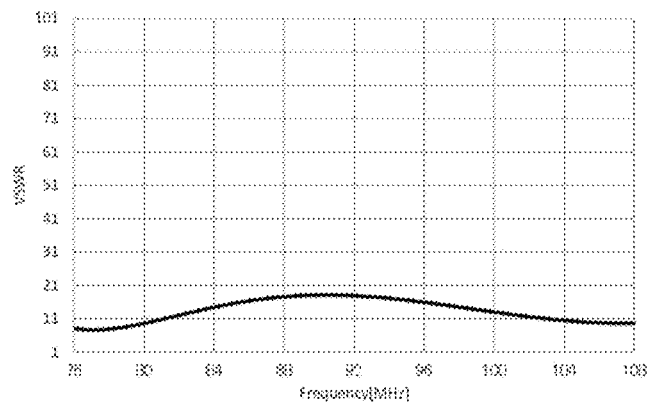
Figure 18:
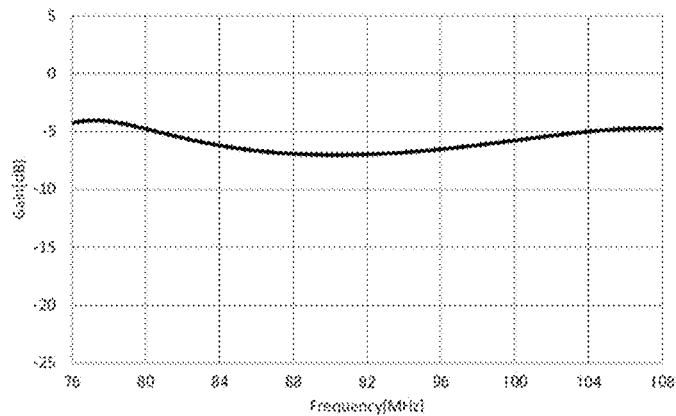

FIG. 18 shows diagrams showing the operating characteristics in a case where the matching circuit 230 is configured with the series C, the shunt L, and the series C. In this matching circuit 230, as shown in (1) in the upper part of FIG. 18, the series C causes the resonance point impedance 401 to move counterclockwise on the Smith chart (marked by a broken line arrow). In addition, as shown in (2) in the upper part of FIG. 18, the shunt L causes the low-frequency range impedance 402 to move to be more inductive on the Smith chart (marked by a broken line arrow). In addition, as show in (3) in the upper part of FIG. 18, the series C causes the resonance point impedance 401 to move to the high impedance side (marked by a broken line arrow).

The VSWR-frequency characteristic diagram of this case is shown in the middle part of FIG. 18, and the gain-frequency characteristic diagram thereof is shown in the lower part of FIG. 18. Viewed from the entire frequency band of from 76 MHz to 108 MHz, the maximum value of the VSWR is 18.1, the minimum value thereof is 7.6, and the deviation therebetween is 10.4. In addition, the maximum value of the gain is −4.0 dB, the minimum value thereof is −7.0 dB, and the deviation therebetween is 3.0 dB. For this reason, in a similar manner to the matching circuit 30 of the first embodiment, the deviation of the VSWR and the deviation of the gain are reduced, which allows the pole antenna 102 to operate over the entire frequency band in a stable manner.

(2-3) Series C+Shunt C+Series L

Figure 19:
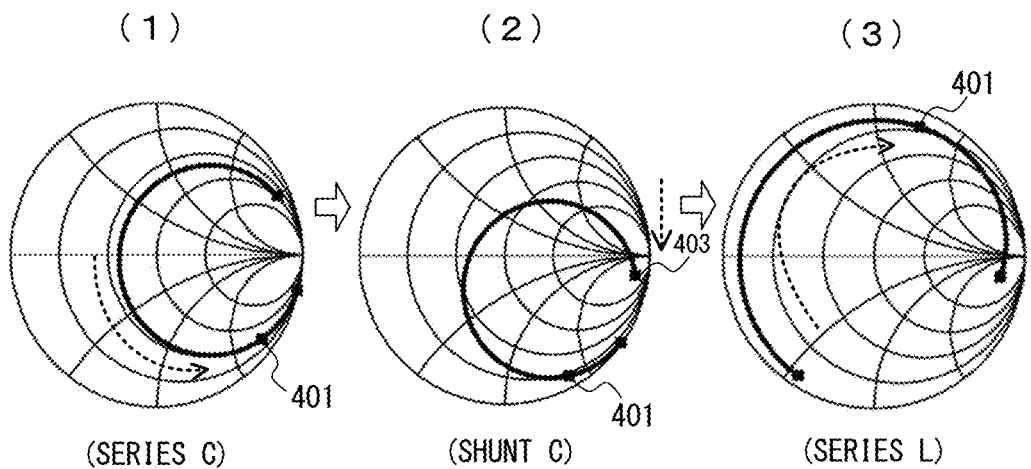
FIG. 19 shows diagrams of states of an impedance and operating characteristics by a matching circuit configured with the series C, the shunt C, and the series L.
Figure 19:
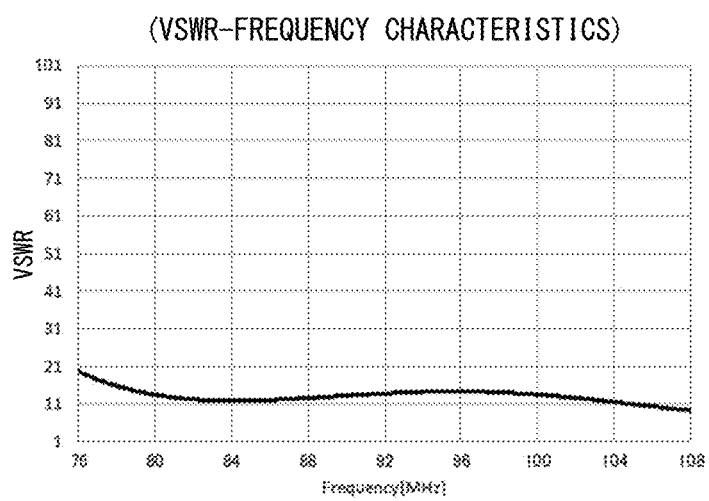
Figure 19:
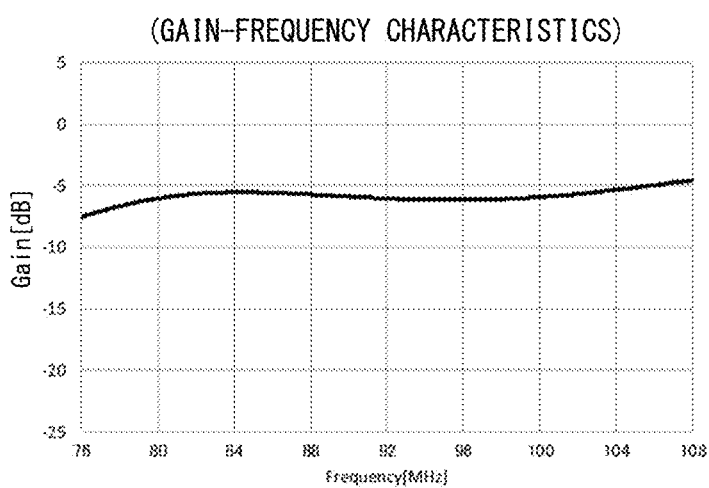

FIG. 19 shows diagrams showing the operating characteristics in a case where the matching circuit 230 is configured with the series C, the shunt C, and the series L. In this matching circuit 230, as shown in (1) in the upper part of FIG. 19, the series C causes the resonance point impedance 401 to move counterclockwise on the Smith chart (marked by a broken line arrow). In addition, as shown in (2) in the upper part of FIG. 19, the shunt C causes the high-frequency range impedance 403 to move to be more capacitive on the Smith chart (marked by a broken line arrow). In addition, as shown in (3) in the upper part of FIG. 19, the series L causes the resonance point impedance 401 to move to the high impedance side (marked by a broken line arrow).

The VSWR-frequency characteristic diagram of this case is shown in the middle part of FIG. 19, and the gain-frequency characteristic diagram thereof is shown in the lower part of FIG. 19. Viewed from the entire frequency band of from 76 MHz to 108 MHz, the maximum value of the VSWR is 19.6, the minimum value thereof is 9.2, and the deviation therebetween is 10.4. In addition, the maximum value of the gain is −4.5 dB, the minimum value thereof is −7.5 dB, and the deviation therebetween is 3.0 dB. For this reason, in a similar manner to the matching circuit 30 of the first embodiment, the deviation of the VSWR and the deviation of the gain are reduced, which allows the pole antenna 102 to operate over the entire frequency band in a stable manner.

(2-4) Series L+Shunt L+Series C

Figure 20:
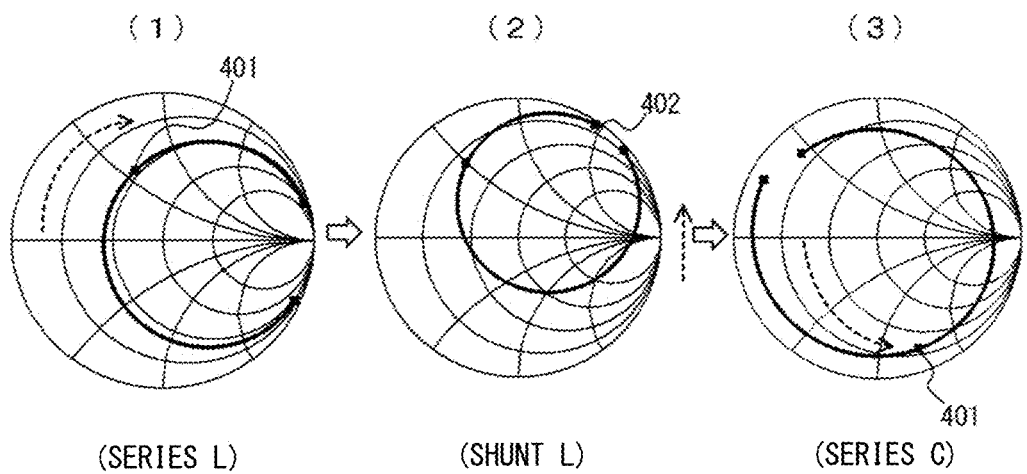
FIG. 20 shows diagrams of states of an impedance and operating characteristics by a matching circuit configured with the series L, the shunt L, and the series C.
Figure 20:
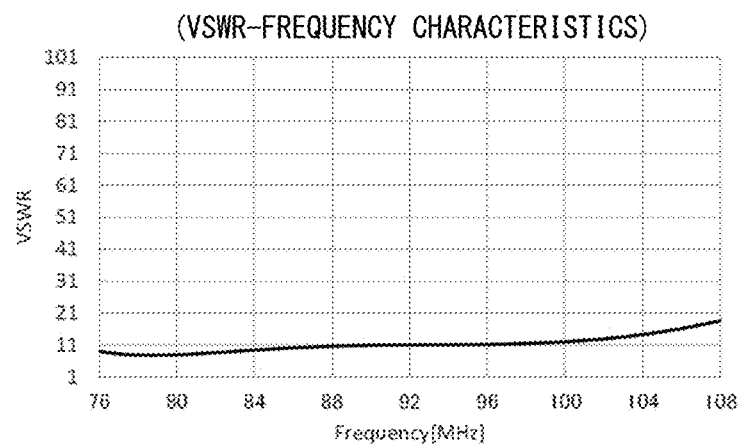
Figure 20:
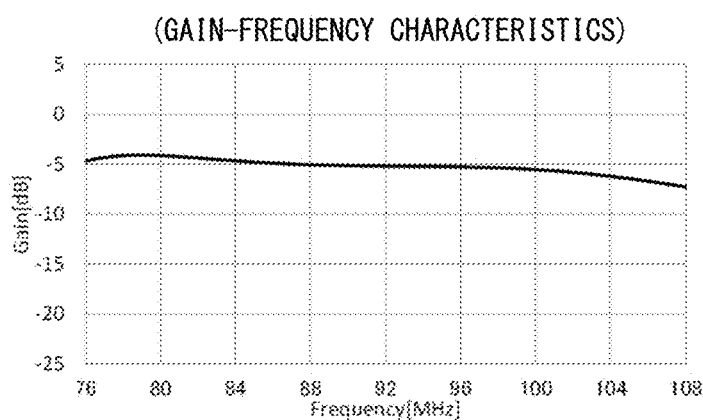

FIG. 20 shows diagrams showing the operating characteristics in a case where the matching circuit 230 is configured with the series L, the shunt L, and the series C. In this matching circuit 230, as shown in (1) in the upper part of FIG. 20, the series L causes the resonance point impedance 401 to move clockwise on the Smith chart (marked by a broken line arrow). In addition, as shown in (2) in the upper part of FIG. 20, the shunt L causes the low-frequency range impedance 402 to move to be more inductive on the Smith chart (marked by a broken line arrow). In addition, as shown in (3) in the upper part of FIG. 20, the series C causes the resonance point impedance 401 to move to the high impedance side (marked by a broken line arrow).

The VSWR-frequency characteristic diagram of this case is shown in the middle part of FIG. 20, and the gain-frequency characteristic diagram thereof is shown in the lower part of FIG. 20. Viewed from the entire frequency band of from 76 MHz to 108 MHz, the maximum value of the VSWR is 18.7, the minimum value thereof is 7.8, and the deviation therebetween is 10.9. In addition, the maximum value of the gain is −4.1 dB, the minimum value thereof is −7.3 dB, and the deviation therebetween is 3.2 dB. For this reason, in a similar manner to the matching circuit 30 of the first embodiment, the deviation of the VSWR and the deviation of the gain are reduced, which allows the pole antenna 102 to operate over the entire frequency band in a stable manner.

Since the operation of the matching circuit 230 in which the third matching circuit 33 is configured with the series C and the series L shown in FIG. 16 is almost similar, the description thereof will be omitted.

Third Embodiment

Figure 21:
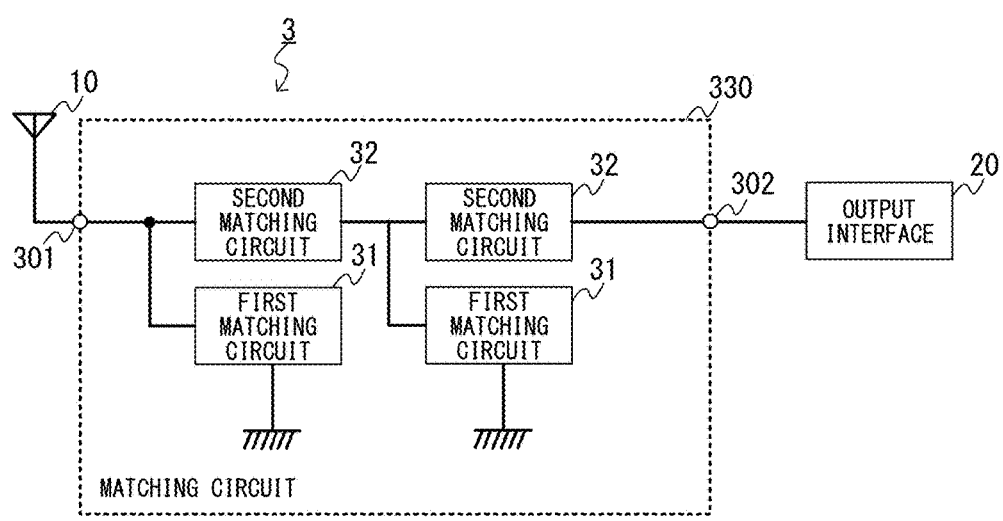
FIG. 21 is a function configuration diagram of an antenna device according to a third embodiment.

Next, a third embodiment of the present invention will be described. FIG. 21 is a functional block diagram of an antenna device 3 according to the third embodiment. In the antenna device 3, the configuration of the matching circuit 330 is different from that of the matching circuits of the antenna device 1 of the first embodiment and that of the antenna device 2 of the second embodiment. The matching circuit 330 is configured by connecting in cascade a plurality of sets of the first matching circuit 31 and the second matching circuit 32 included in the matching circuit 30 of the first embodiment. The illustrated example is an example in the case of two sets. Other configurations of the antenna device 3 and the matching circuit 330 are the same as those of the antenna device 1 and the matching circuit 30 of the first embodiment.

Hereinafter, the state of the impedance and the operating characteristics of the pole antenna 102 according to an aspect of connection of the capacitor C and the inductor L in the matching circuit 330 will be specifically described.

(3-1) Shunt C+Series L+Shunt C+Series L

Figure 22:
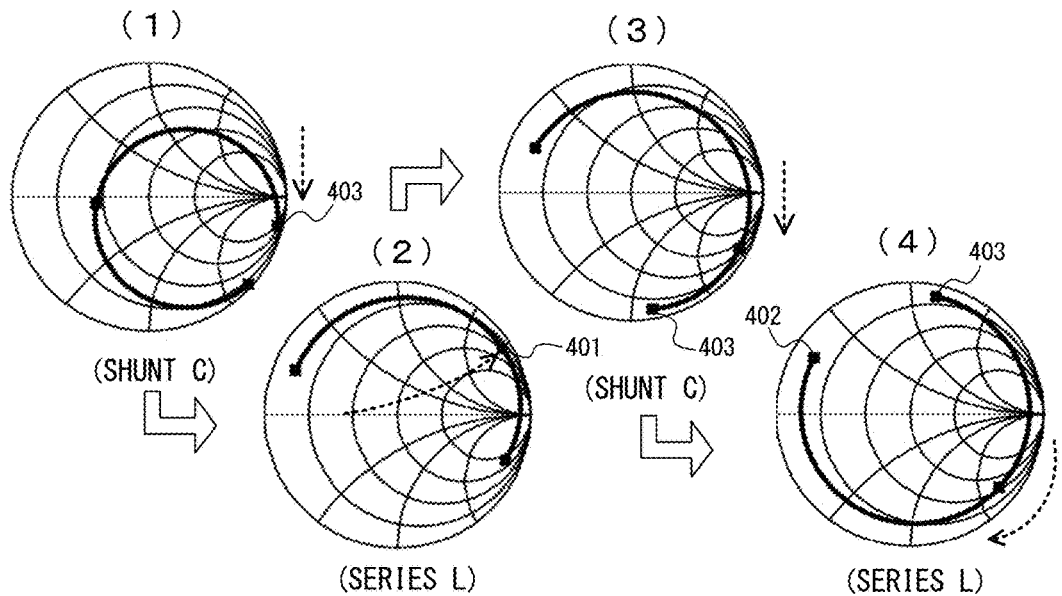
FIG. 22 shows diagrams of states of an impedance and operating characteristics by a matching circuit configured with the shunt C, the series L, the shunt C, and the series L.
Figure 22:
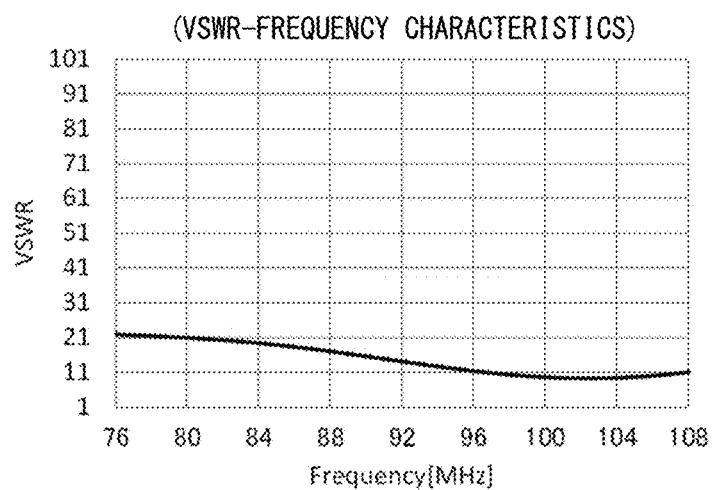
Figure 22:
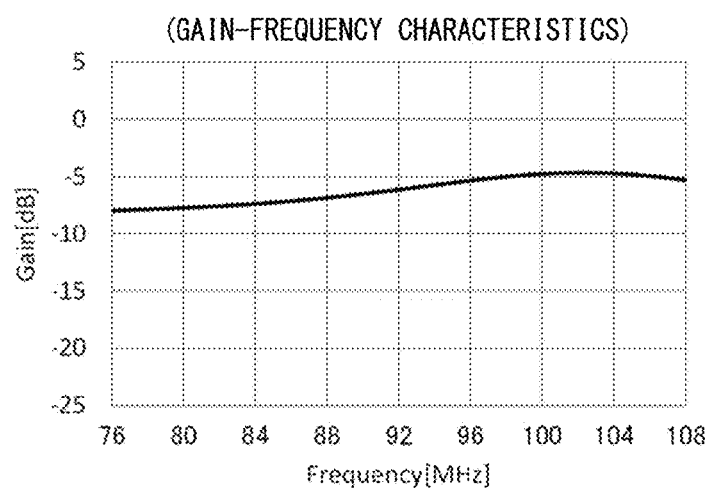

FIG. 22 shows diagrams showing the operating characteristics in a case where the matching circuit 330 is configured with the shunt C, the series L, the shunt C, and the series L. In this matching circuit 330, as shown in (1) in the upper part of FIG. 22, the shunt C causes the high-frequency range impedance 403 to move to be more capacitive on the Smith chart (marked by a broken line arrow). In addition, as shown in (2) in the upper part of FIG. 22, the series L causes the resonance point impedance 401 to move to the high impedance side on the Smith chart (marked by a broken line arrow). At this point of time, the bandwidth can be widened. In addition, as shown in (3) in the upper part of FIG. 22, the shunt C causes the high-frequency range impedance 403 to move clockwise on a constant conductance circle on the Smith chart (marked by a broken line arrow). As a result, the impedance in the high-frequency range is lowered. Further, as shown in (4) in the upper part of FIG. 22, the series L causes the high-frequency range impedance 403 (the same applies to the low-frequency range impedance 402) to move clockwise on the Smith chart (marked by a broken line arrow). As a result, minute fluctuations (ripples) of the VSWR are reduced.

The VSWR-frequency characteristic diagram of this case is shown in the middle part of FIG. 22, and the gain-frequency characteristic diagram thereof is shown in the lower part of FIG. 22. Viewed from the entire frequency band of from 76 MHz to 108 MHz, the maximum value of the VSWR is 21.9, the minimum value thereof is 9.3, and the deviation therebetween is 12.6. In addition, the maximum value of the gain is −4.6 dB, the minimum value thereof is −8.0 dB, and the deviation therebetween is 3.3 dB. For this reason, in a similar manner to the first and second embodiments, the deviation of the VSWR and the deviation of the gain are reduced, which allows the pole antenna 102 to operate over the entire frequency band in a stable manner. As a result, the bandwidth that can be received by the pole antenna 102 can be further broadened as compared with the bandwidth of the first embodiment.

(3-2) Shunt L+Series C+Shunt L+Series C

Figure 23:
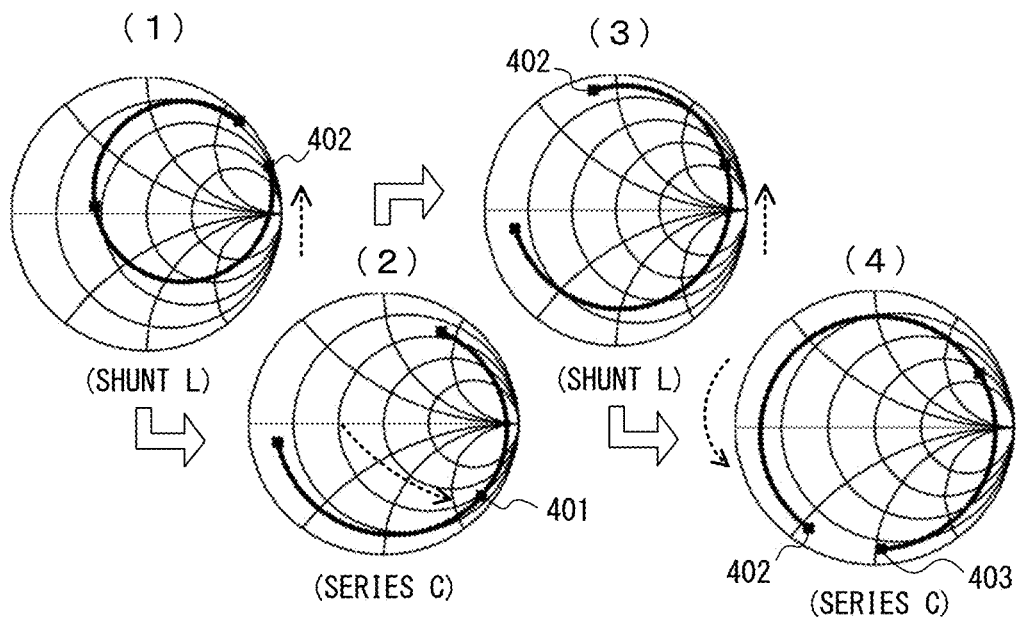
FIG. 23 shows diagrams of states of an impedance and operating characteristics by a matching circuit configured with the shunt L, the series C, the shunt L, and the series C.
Figure 23:
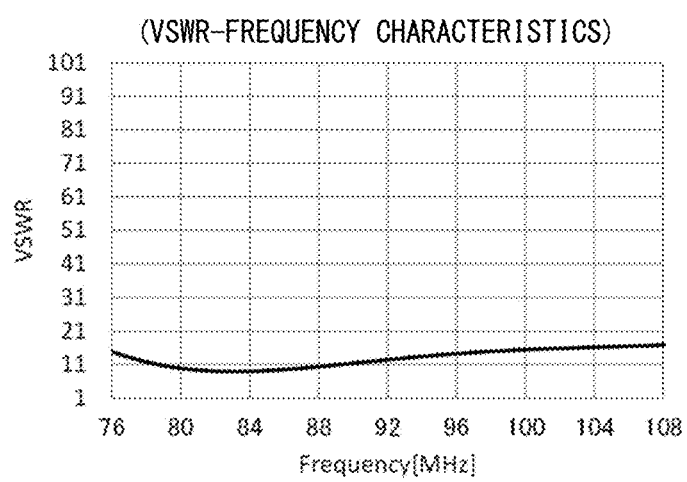
Figure 23:
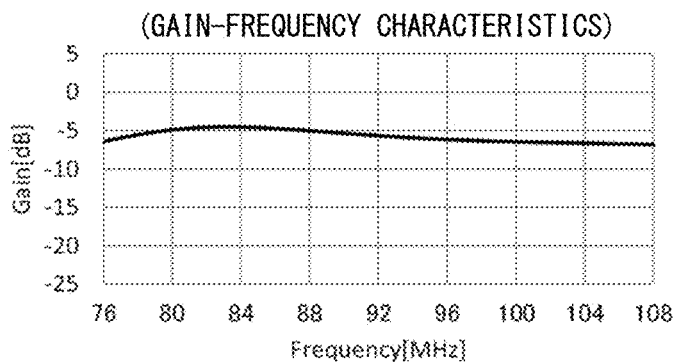

FIG. 23 shows diagrams showing the operating characteristics in a case where the matching circuit 330 is configured with the shunt L, the series C, the shunt L, and the series C. In this matching circuit 330, as shown in (1) in the upper part of FIG. 23, the shunt L causes the low-frequency range impedance 402 to move to be more inductive on the Smith chart (marked by a broken line arrow). In addition, as shown in (2) in the upper part of FIG. 23, the series C causes the resonance point impedance 401 to move to the high impedance side (marked by a broken line arrow). At this point of time, the bandwidth can be widened. Further, as shown in (3) in the upper part of FIG. 23, the shunt L causes the low-frequency range impedance 402 to move counterclockwise on the constant conductance circle (marked by a broken line arrow). As a result, the low-frequency range impedance 402 is lowered. Further, as shown in (4) in the upper part of FIG. 23, the series C causes the low-frequency range impedance 402 (the same applies to the high-frequency range impedance 403) to move counterclockwise on the Smith chart (marked by a broken line arrow). As a result, minute fluctuations (ripples) of the VSWR are reduced.

The VSWR-frequency characteristic diagram of this case is shown in the middle part of FIG. 23, and the gain-frequency characteristic diagram thereof is shown in the lower part of FIG. 23. Viewed from the entire frequency band of from 76 MHz to 108 MHz, the maximum value of the VSWR is 16.8, the minimum value thereof is 8.9, and the deviation therebetween is 7.9. In addition, the maximum value of the gain is −4.5 dB, the minimum value thereof is −6.8 dB, and the deviation therebetween is 2.3 dB. For this reason, in a similar manner to the first and second embodiments, the deviation of the VSWR and the deviation of the gain are reduced, which allows the antenna 10 to operate over the entire frequency band in a stable manner. As a result, the bandwidth that can be received by the antenna 10 can be further broadened as compared with the bandwidth of the first embodiment.

(3-3) Shunt C+Series L+Shunt L+Series C

Figure 24:
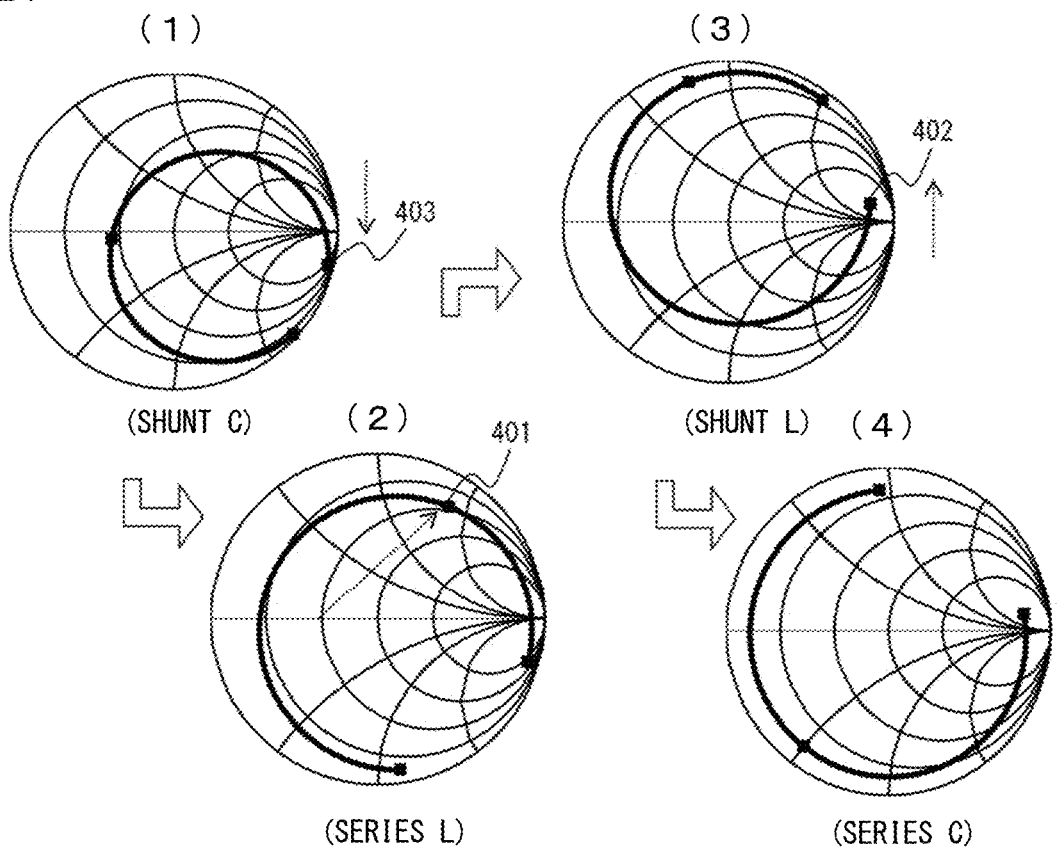
FIG. 24 shows diagrams of states of an impedance and operating characteristics by a matching circuit configured with the shunt C, the series L, the shunt L, and the series C.
Figure 24:
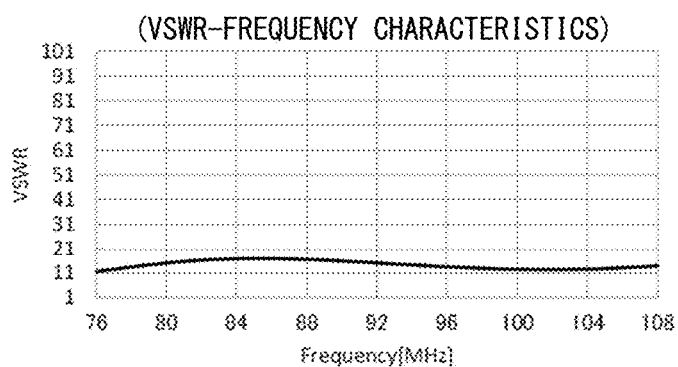
Figure 24:
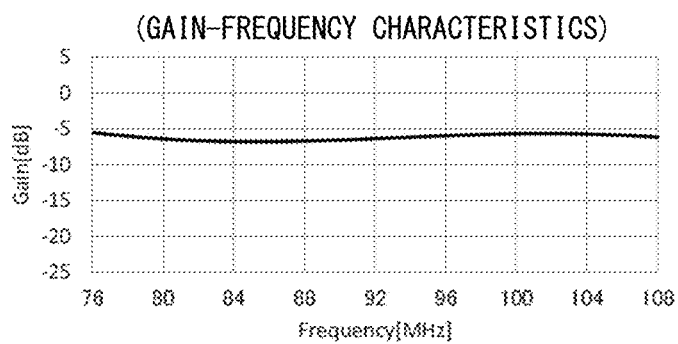

FIG. 24 shows diagrams showing the operating characteristics in a case where the matching circuit 330 is configured with the shunt C, the series L, the shunt L, and the series C. In this matching circuit 330, as shown in (1) in the upper part of FIG. 24, the shunt C causes the high-frequency range impedance 403 to move to be more capacitive on the Smith chart (marked by a broken line arrow). In addition, as shown in (2) in the upper part of FIG. 24, the series L causes the resonance point impedance 401 to move to the high impedance side (marked by a broken line arrow). At this point of time, the bandwidth can be widened. Further, as shown in (3) in the upper part of FIG. 24, the shunt L causes the low-frequency range impedance 402 to move to be more inductive side (marked by a broken line arrow). Further, as shown in (4) in the upper part of FIG. 24, the series C causes the frequency characteristics of the VSWR to be adjusted. That is, minute fluctuations (ripples) are reduced.

The VSWR-frequency characteristic diagram of this case is shown in the middle part of FIG. 24, and the gain-frequency characteristic diagram thereof is shown in the lower part of FIG. 24. Viewed from the entire frequency band of from 76 MHz to 108 MHz, the maximum value of the VSWR is 16.8, the minimum value thereof is 11.5, and the deviation therebetween is 5.3. In addition, the maximum value of the gain is −5.5 dB, the minimum value thereof is −6.8 dB, and the deviation therebetween is 1.3 dB. For this reason, in a similar manner to the first and second embodiments, the deviation of the VSWR and the deviation of the gain are reduced, which allows the antenna 10 to operate over the entire frequency band in a stable manner. As a result, the bandwidth that can be received by the antenna 10 can be further broadened as compared with the bandwidth of the first embodiment.

(3-4) Shunt L+Series C+Shunt C+Series L

Figure 25:
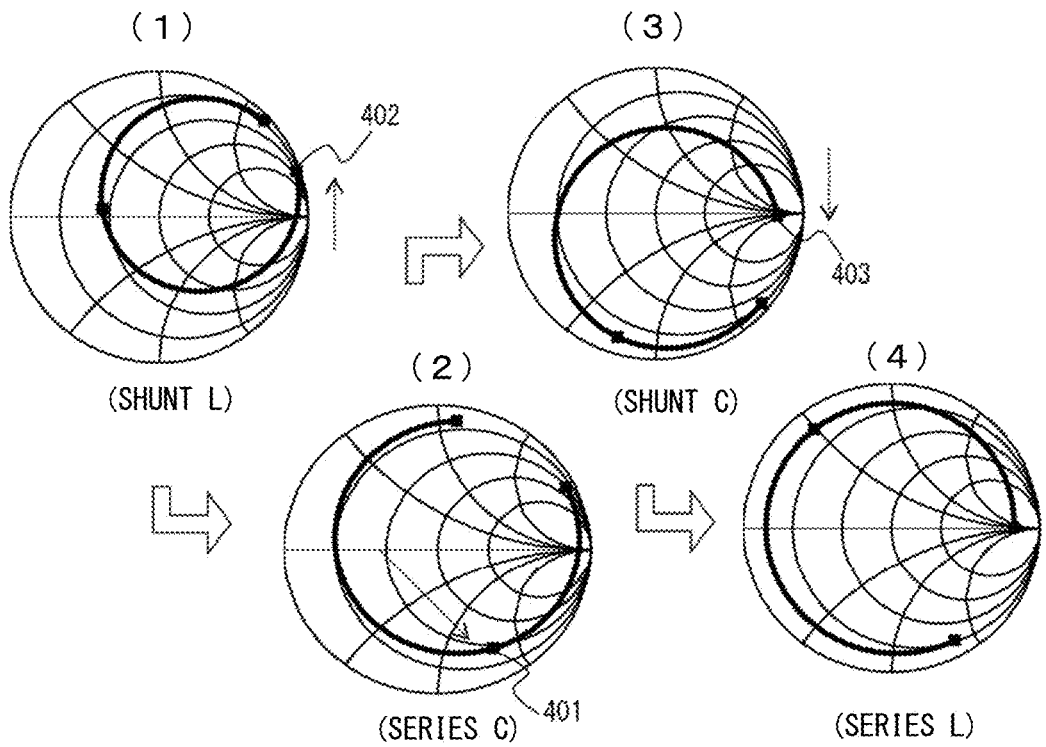
FIG. 25 shows diagrams of states of an impedance and operating characteristics by a matching circuit configured with the shunt L, the series C, the shunt C, and the series L.
Figure 25:
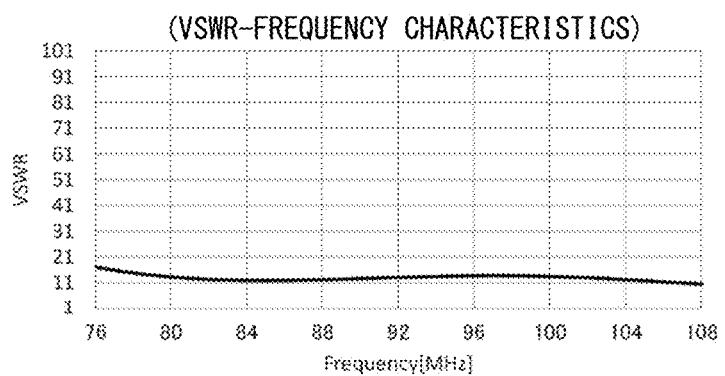
Figure 25:
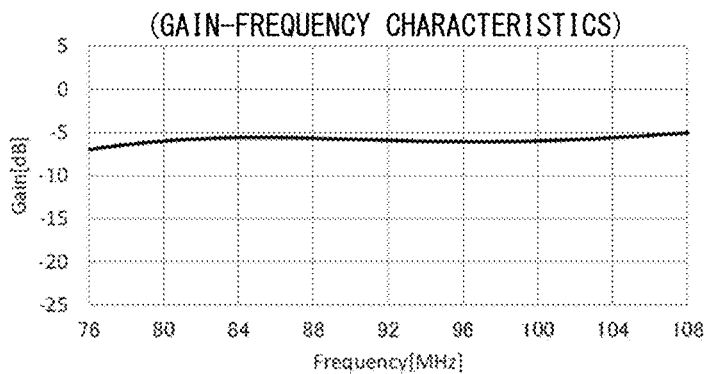

FIG. 25 shows diagrams showing the operating characteristics in a case where the matching circuit 330 is configured with the shunt L, the series C, the shunt C, and the series L. In this matching circuit 330, as shown in (1) in the upper part of FIG. 25, the shunt L causes the low-frequency range impedance 402 to move to be more inductive on the Smith chart (marked by a broken line arrow). In addition, as shown in (2) in the upper part of FIG. 25, the series C causes the resonance point impedance 401 to move to the high impedance side (marked by a broken line arrow). At this point of time, the bandwidth can be widened. Further, as shown in (3) in the upper part of FIG. 25, the shunt C causes the high-frequency range impedance 403 to move to be more capacitive side (marked by a broken line arrow). Further, as shown in (4) in the upper part of FIG. 25, the series L causes minute fluctuations (ripples) of the VSWR to be reduced.

The VSWR-frequency characteristic diagram of this case is shown in the middle part of FIG. 25, and the gain-frequency characteristic diagram thereof is shown in the lower part of FIG. 25. Viewed from the entire frequency band of from 76 MHz to 108 MHz, the maximum value of the VSWR is 17.2, the minimum value thereof is 10.5, and the deviation therebetween is 6.7. In addition, the maximum value of the gain is −5.0 dB, the minimum value thereof is −7.0 dB, and the deviation therebetween is 1.9 dB. For this reason, in a similar manner to the first and second embodiments, the deviation of the VSWR and the deviation of the gain are reduced, which allows the pole antenna 102 to operate over the entire frequency band in a stable manner. As a result, the bandwidth that can be received by the pole antenna 102 can be further broadened as compared with the bandwidth of the first embodiment.

FIGS. 22 to 25 show examples in which two sets of the first matching circuit 31 and the second matching circuit 32 are connected in cascade, but two or more sets may be used.

[Operation in the Case of SF Antenna]

The above description is based on the assumption that the antenna 10 is the pole antenna (helical antenna) 102 of FIG. 2A, but the SF antenna 112 of FIG. 2B also operates in a similar manner to the above. Instead, effects of widening the bandwidth caused by the matching circuits 30, 230, and 330 may be more significant in the SF antenna 112. This will be described below.

Figure 26:
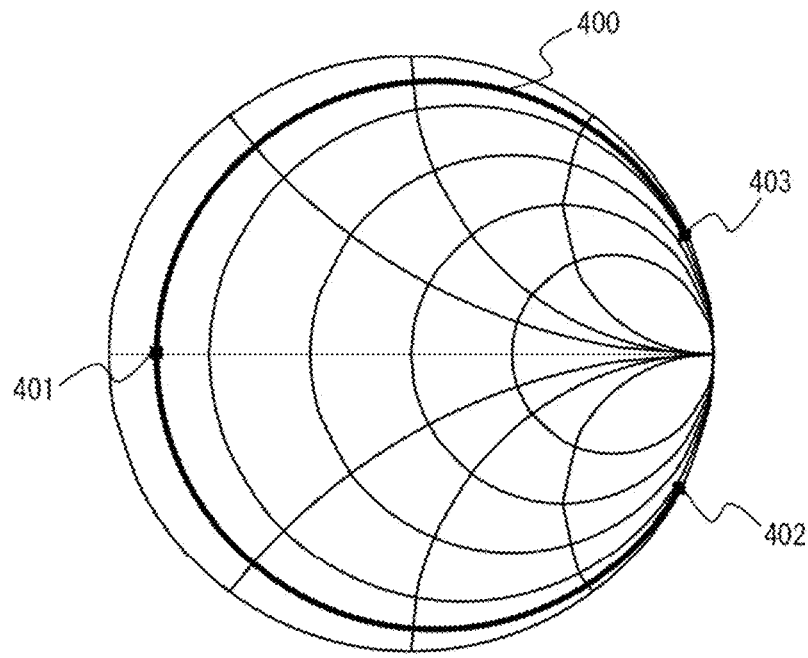
FIG. 26 shows a Smith chart of a state of an impedance of only an SF antenna and diagrams showing operating characteristics in a case where a conventional matching circuit (a matching circuit of a comparative example) is added thereto.
Figure 26:
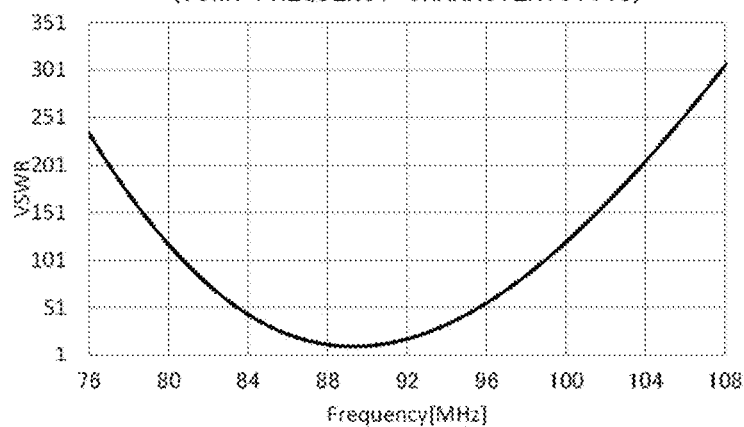
Figure 26:
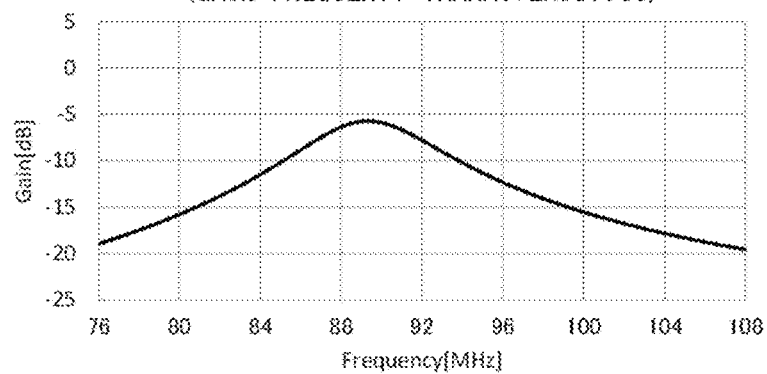

The upper part of FIG. 26 shows a Smith chart showing the locus of impedance of the SF antenna 112 and corresponding to the Smith chart of the pole antenna 102 shown in the upper part of FIG. 4. In the Smith chart of FIG. 26, 400 denotes a locus of impedance of the SF antenna 112, and the definitions of the impedance 400, a resonance point impedance 401, a low-frequency range impedance 402, and a high-frequency range impedance 403 are the same as those of the pole antenna 102. In the case of the SF antenna 112, since the resistance component of the real axis is 10Ω for less, the diameter of the constant resistance circle is larger than that of the pole antenna 102. The impedance is less than 1000 nH. In a similar manner to the pole antenna 102, the SF antenna 112 also has an impedance that is capacitive in the low-frequency range and inductive in the high-frequency range of the entire frequency band.

For example, it is assumed that Comparative Example 5 (a matching circuit of a conventional type) shown in FIG. 9 is added to the SF antenna 112. The transition of impedance in this case is as shown in the Smith charts of (1) to (4) in the upper part of FIG. 14. The middle part of FIG. 26 is the VSWR-frequency characteristic diagram of the SF antenna 112, and the lower part of FIG. 26 is the gain-frequency characteristic diagram of the SF antenna 112. Each of the horizontal axes represents a frequency (MHz). Viewed from the entire frequency band of from 76 MHz to 108 MHz, the VSWR has a minimum value of 10.4 in the vicinity of the resonance frequency of 90 MHz and a maximum value of 305.5 in the high-frequency range of 108 MHz. The deviation of the VSWR is 295.2. The deviation of the VSWR is larger than that of the pole antenna 102 due to the fact that the SF antenna 112 is configured with a plurality of elements and the fact that the length of the SF antenna 112 is approximately 18/50 or less of the pole antenna 102. The gain has a maximum value of −5.7 dB in the vicinity of the resonance frequency of 90 MHz and a minimum value of −19.6 dB in the high-frequency range of 108 MHz. The deviation of the gain is 13.9.

Next, the state of the impedance and the operating characteristics of the SF antenna 112 in a case where the matching circuit 30 of the first embodiment is added in place of Comparative Example 5 will be described below.

(4-1) Shunt C+Series L

Figure 27:
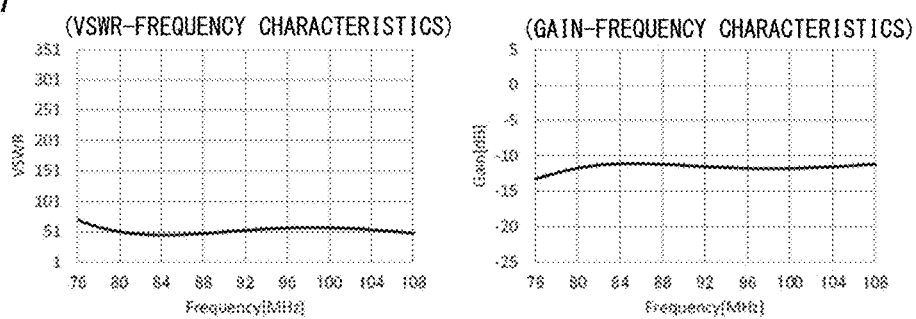
FIG. 27 shows diagrams of operating characteristics in a case where a matching circuit configured with the shunt C and the series L is added to the SF antenna.

The impedance of the SF antenna 112 in a case where the matching circuit 30 is configured with the shunt C and the series L changes as shown in (1) and (2) in the upper part of FIG. 7. The VSWR-frequency characteristic diagram of this case and the gain-frequency characteristic diagram thereof are shown in FIG. 27. Viewed from the entire frequency band of from 76 MHz to 108 MHz, the maximum value of the VSWR is 70.7, the minimum value thereof is 45.4, and the deviation therebetween is 25.2. The deviation is reduced by 270 as compared with 295.2, which is the deviation of the VSWR when Comparative Example 5 is added. In addition, the maximum value of the gain is −11.1 dB, the minimum value thereof is −13.3 dB, and the deviation therebetween is 2.2 dB. The deviation is reduced by 11.7 dB as compared with 13.9 dB, which is the deviation of the gain when Comparative Example 5 is added.

(4-2) Shunt L+Series C

Figure 28:
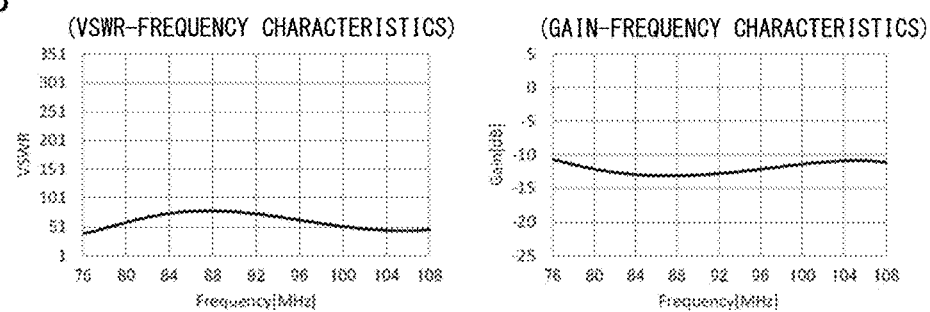
FIG. 28 shows diagrams of operating characteristics in a case where a matching circuit configured with the shunt L and the series C is added to the SF antenna.

The impedance of the SF antenna 112, in a case where the matching circuit 30 is configured with the shunt L and the series C, changes as shown in (1) and (2) in the upper part of FIG. 8. The VSWR-frequency characteristic diagram of this case and the gain-frequency characteristic diagram thereof are shown in FIG. 28. Viewed from the entire frequency band of from 76 MHz to 108 MHz, the maximum value of the VSWR is 79.5, the minimum value thereof is 39.4, and the deviation therebetween is 40.1. The deviation is reduced by 255.1 as compared with 295.2, which is the deviation of the VSWR when Comparative Example 5 is added. In addition, the maximum value of the gain is −10.7 dB, the minimum value thereof is −13.1 dB, and the deviation therebetween is 2.4 dB. The deviation is reduced by 11.5 dB as compared with 13.9 dB, which is the deviation of the gain when Comparative Example 5 is added.

Next, the state of the impedance and the operating characteristics of the SF antenna 112 in a case where the matching circuit 230 of the second embodiment is added in place of the matching circuit 30 of the first embodiment will be described.

(5-1) Series L+Shunt C+Series L

Figure 29:
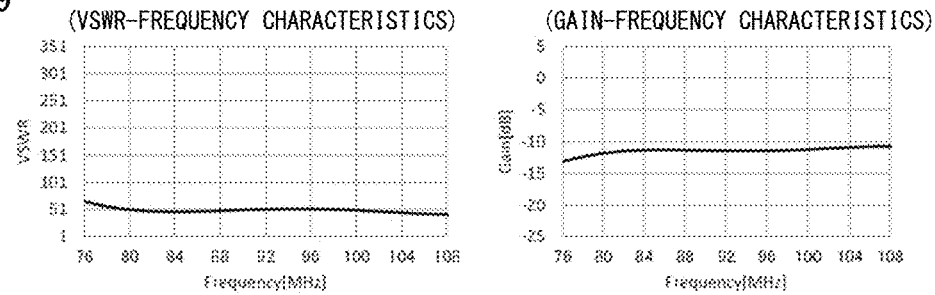
FIG. 29 shows diagrams of operating characteristics in a case where a matching circuit configured with the series L, the shunt C, and the series L is added to the SF antenna.

The impedance of the SF antenna 112, in a case where the matching circuit 230 is configured with the series L, the shunt C, and the series L changes as shown in (1) to (3) in the upper part of FIG. 17. The VSWR-frequency characteristic diagram of this case and the gain-frequency characteristic diagram thereof are shown in FIG. 29. Viewed from the entire frequency band of from 76 MHz to 108 MHz, the maximum value of the VSWR is 66.0, the minimum value thereof is 42.0, and the deviation therebetween is 24.0. The deviation is reduced by 271.2 as compared with 295.2, which is the deviation of the VSWR when Comparative Example 5 is added. In addition, the maximum value of the gain is −10.7 dB, the minimum value thereof is −13.1 dB, and the deviation therebetween is 2.4 dB. The deviation is reduced by 11.5 dB as compared with 13.9, which is the deviation of the gain when Comparative Example 5 is added.

(5-2) Series C+Shunt L+Series C

Figure 30:
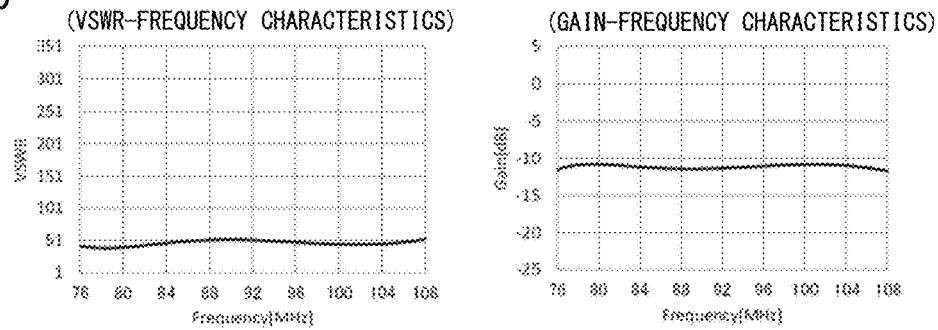
FIG. 30 shows diagrams of operating characteristics in a case where a matching circuit configured with the series C, the shunt L, and the series C is added to the SF antenna.

The impedance of the SF antenna 112, in a case where the matching circuit 230 is configured with the series C, the shunt L, and the series C, changes as shown in (1) to (3) in the upper part of FIG. 18. The VSWR-frequency characteristic diagram of this case and the gain-frequency characteristic diagram thereof are shown in FIG. 30. Viewed from the entire frequency band of from 76 MHz to 108 MHz, the maximum value of the VSWR is 53.1, the minimum value thereof is 39.4, and the deviation therebetween is 13.7. The deviation is reduced by 281.5 as compared with 295.2, which is the deviation of the VSWR when Comparative Example 5 is added. In addition, the maximum value of the gain is −10.8 dB, the minimum value thereof is −11.7 dB, and the deviation therebetween is 0.9 dB. The deviation is reduced by 13.0 dB as compared with 13.9, which is the deviation of the gain when Comparative Example 5 is added.

(5-3) Series C+Shunt C+Series L

Figure 31:
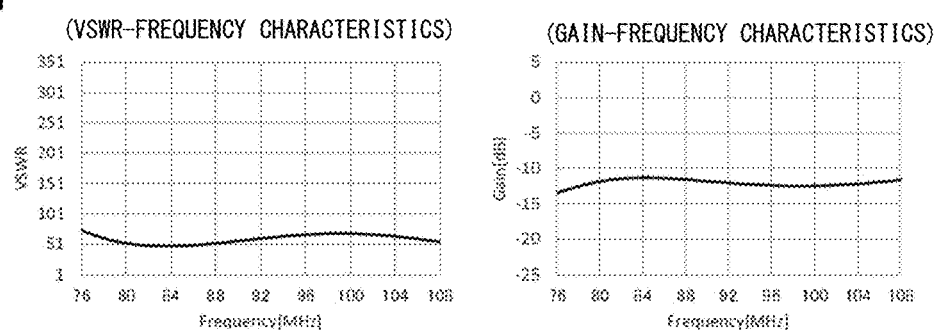
FIG. 31 shows diagrams of operating characteristics in a case where a matching circuit configured with the series C, the shunt C, and the series L is added to the SF antenna.

The impedance of the SF antenna 112, in a case where the matching circuit 230 is configured with the series C, the shunt C, and the series L, changes as shown in (1) to (3) in the upper part of FIG. 19. The VSWR-frequency characteristic diagram of this case and the gain-frequency characteristic diagram thereof are shown in FIG. 31. Viewed from the entire frequency band of from 76 MHz to 108 MHz, the maximum value of the VSWR is 73.8, the minimum value thereof is 47.5, and the deviation therebetween is 26.3. The deviation is reduced by 268.9 as compared with 295.2, which is the deviation of the VSWR when Comparative Example 5 is added. In addition, the maximum value of the gain is −11.3 dB, the minimum value thereof is −13.5 dB, and the deviation therebetween is 2.1 dB. The deviation is reduced by 11.8 dB as compared with 13.9, which is the deviation of the gain when Comparative Example 5 is added.

(5-4) Series L+Shunt L+Series C

Figure 32:
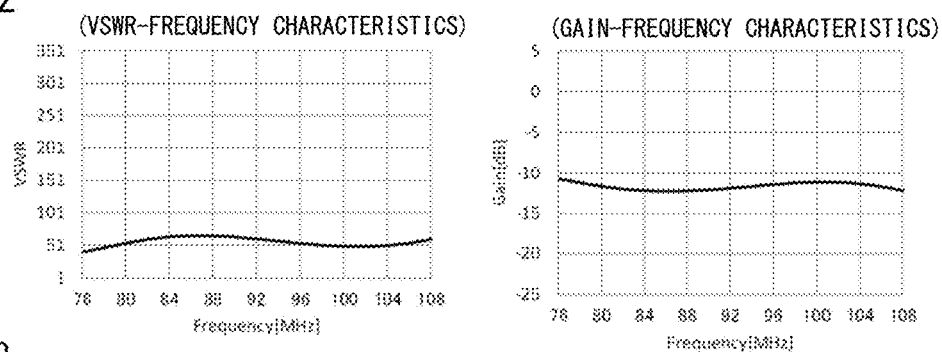
FIG. 32 shows diagrams of operating characteristics in a case where a matching circuit configured with the series L, the shunt L, and the series C is added to the SF antenna.

The impedance of the SF antenna 112, in a case where the matching circuit 230 is configured with the series L, the shunt L, and the shunt C, changes as shown in (1) to (3) in the upper part of FIG. 20. The VSWR-frequency characteristic diagram of this case and the gain-frequency characteristic diagram thereof are shown in FIG. 32. Viewed from the entire frequency band of from 76 MHz to 108 MHz, the maximum value of the VSWR is 65.6, the minimum value thereof is 40.4, and the deviation therebetween is 25.2. The deviation is reduced by 270.0 as compared with 295.2, which is the deviation of the VSWR when Comparative Example 5 is added. In addition, the maximum value of the gain is −10.8 dB, the minimum value thereof is −12.3 dB, and the deviation therebetween is 1.5 dB. The deviation is reduced by 12.4 dB as compared with 13.9, which is the deviation of the gain when Comparative Example 5 is added.

Next, the state of the impedance and the operating characteristics of the SF antenna 112 in a case where the matching circuit 330 of the third embodiment is added in place of the matching circuit 230 of the second embodiment will be described.

(6-1) Shunt C+Series L+Shunt C+Series L

Figure 33:
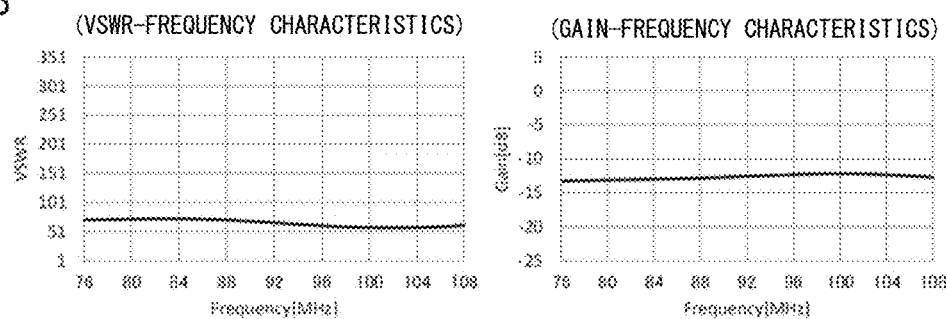
FIG. 33 shows diagrams of operating characteristics in a case where a matching circuit configured with the shunt C, the series L, and the shunt C is added to the SF antenna.

The impedance of the SF antenna 112, in a case where the matching circuit 230 is configured with the shunt C, the series L, the shunt C, and the series L, changes as shown in (1) to (4) in the upper part of FIG. 22. The VSWR-frequency characteristic diagram of this case and the gain-frequency characteristic diagram thereof are shown in FIG. 33. Viewed from the entire frequency band of from 76 MHz to 108 MHz, the maximum value of the VSWR is 73.9, the minimum value thereof is 57.9, and the deviation therebetween is 15.9. The deviation is reduced by 279.3 as compared with 295.2, which is the deviation of the VSWR when Comparative Example 5 is added. In addition, the maximum value of the gain is −12.2 dB, the minimum value thereof is −13.3 dB, and the deviation therebetween is 1.1 dB. The deviation is reduced by 12.8 dB as compared with the 13.9, which is the deviation of the gain when Comparative Example 5 is added.

(6-2) Shunt L+Series C+Shunt L+Series C

Figure 34:
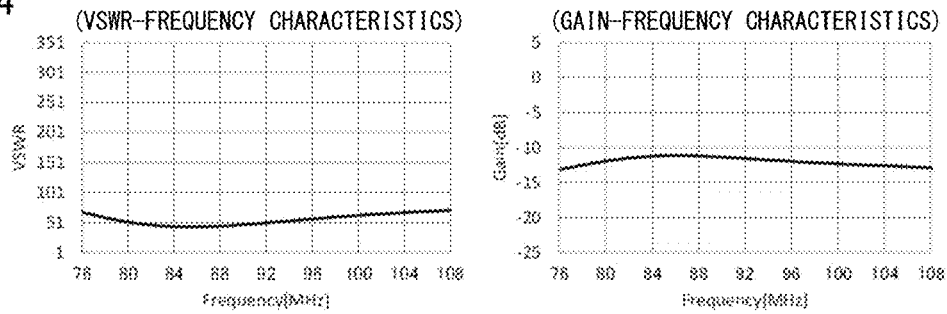
FIG. 34 shows diagrams of operating characteristics in a case where a matching circuit configured with the shunt L, the series C, the shunt L, and the series C is added to the SF antenna.

The impedance of the SF antenna 112, in a case where the matching circuit 230 is configured with the shunt L, the series C, the shunt L, and the series C, changes as shown in (1) to (4) in the upper part of FIG. 23. The VSWR-frequency characteristic diagram of this case and the gain-frequency characteristic diagram thereof are shown in FIG. 34. Viewed from the entire frequency band of from 76 MHz to 108 MHz, the maximum value of the VSWR is 71.8, the minimum value thereof is 44.2, and the deviation therebetween is 27.6. The deviation is reduced by 267.6 as compared with 295.2, which is the deviation of the VSWR when Comparative Example 5 is added. In addition, the maximum value of the gain is −11.1 dB, the minimum value thereof is −13.1 dB, and the deviation therebetween is 2.0 dB. The deviation is reduced by 11.9 dB as compared with 13.9, which is the deviation of the gain when Comparative Example 5 is added.

(6-3) Shunt C+Series L+Shunt L+Series C

Figure 35:
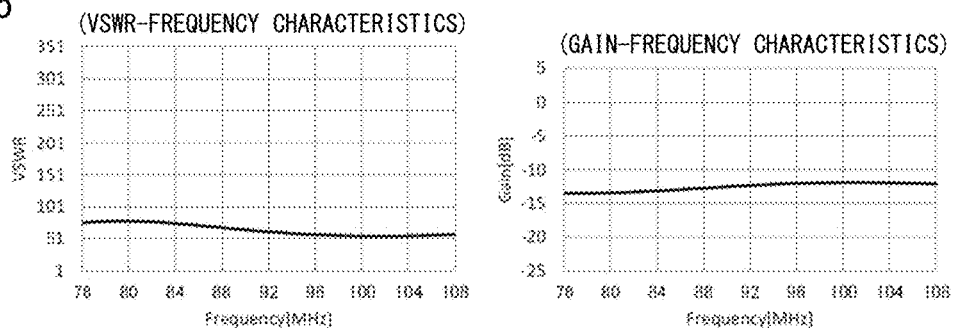
FIG. 35 shows diagrams of operating characteristics in a case where a matching circuit configured with the shunt C, the series L, the shunt L, and the series C is added to the SF antenna.

The impedance of the SF antenna 112, in a case where the matching circuit 230 is configured with the shunt C, the series L, the shunt L, and the series C, changes as shown in (1) to (4) in the upper part of FIG. 24. The VSWR-frequency characteristic diagram of this case and the gain-frequency characteristic thereof are shown in FIG. 35. Viewed from the entire frequency band of from 76 MHz to 108 MHz, the maximum value of the VSWR is 78.8, the minimum value thereof is 55.1, and the deviation therebetween is 23.7. The deviation is reduced by 271.5 as compared with 295.2, which is the deviation of the VSWR when Comparative Example 5 is added. In addition, the maximum value of the gain is −11.9 dB, the minimum value thereof is −13.5 dB, and the deviation therebetween is 1.6 dB. The deviation is reduced by 12.3 dB as compared with 13.9, which is the deviation of the gain when Comparative Example 5 is added.

(6-4) Shunt L+Series C+Shunt C+Series L

Figure 36:
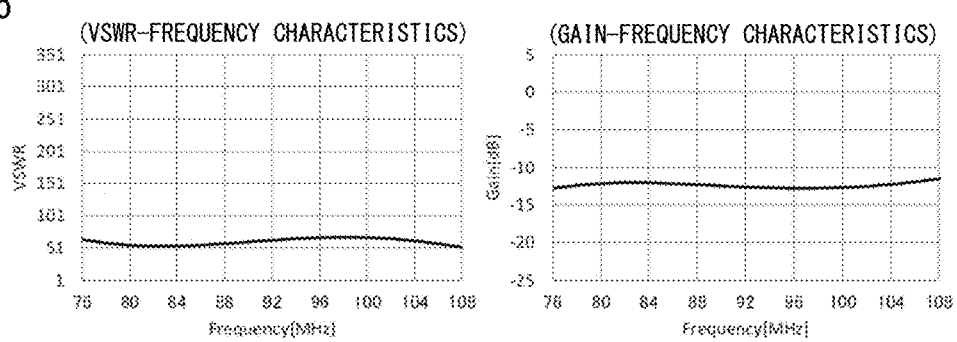
FIG. 36 shows diagrams of operating characteristics in a case where a matching circuit configured with the shunt L, the series C, the shunt C, and the series L is added to the SF antenna.

The impedance of the SF antenna 112, in a case where the matching circuit 230 is configured with the shunt L, the series C, the shunt C, and the series L, changes as shown in (1) to (4) in the upper part of FIG. 25. The VSWR-frequency characteristic diagram of this case and the gain-frequency characteristic diagram thereof are shown in FIG. 36. Viewed from the entire frequency band of from 76 MHz to 108 MHz, the maximum value of the VSWR is 68.0, the minimum value thereof is 52.3, and the deviation therebetween is 15.7. The deviation is reduced by 279.5 as compared with 295.2, which is the deviation of the VSWR when Comparative Example 5 is added. In addition, the maximum value of the gain is −11.5 dB, the minimum value thereof is −12.8 dB, and the deviation therebetween is 1.3 dB. The deviation is reduced by 12.6 dB as compared with 13.9, which is the deviation of the gain when Comparative Example 5 is added.

As described above, although the deviation of the VSWR in the SF antenna 112 differs from that in the pole antenna 102 due to the antenna configuration, the deviation of the gain is 10.0 dB or less that is similar to that of the pole antenna 102. For this reason, only one amplifier circuit at the subsequent stage is sufficient.

In the first to third embodiments, examples of the matching circuits 30, 230, and 330 each added to the antenna 10 used in the frequency band of from 76 MHz to 108 MHz have been described. However, the scope of the present invention is not limited to the above frequency band as long as the matching circuit is added to the antenna of a resonant type, because the operating characteristics of such a matching circuit is similar to those described above.

Fourth Embodiment

Next, as a fourth embodiment of the present invention, an example of the embodiment in which an antenna size is focused on will be described. Effects obtained by adding the matching circuits 30, 230, and 330 (that the difference is reduced between a maximum value and a minimum value of gain from the low-frequency range away from the resonance point to lower frequencies to the high-frequency range away therefrom to higher frequencies) may be significant in the SF antenna, which is as described in the third embodiment. The SF antenna is an antenna having a structure in which a shark fin element and a coil element are combined as described above, but the antenna size is determined by the shape and structure as well as the size of the shark fin element for loading a ground capacitance on the coil element.

Figure 37:
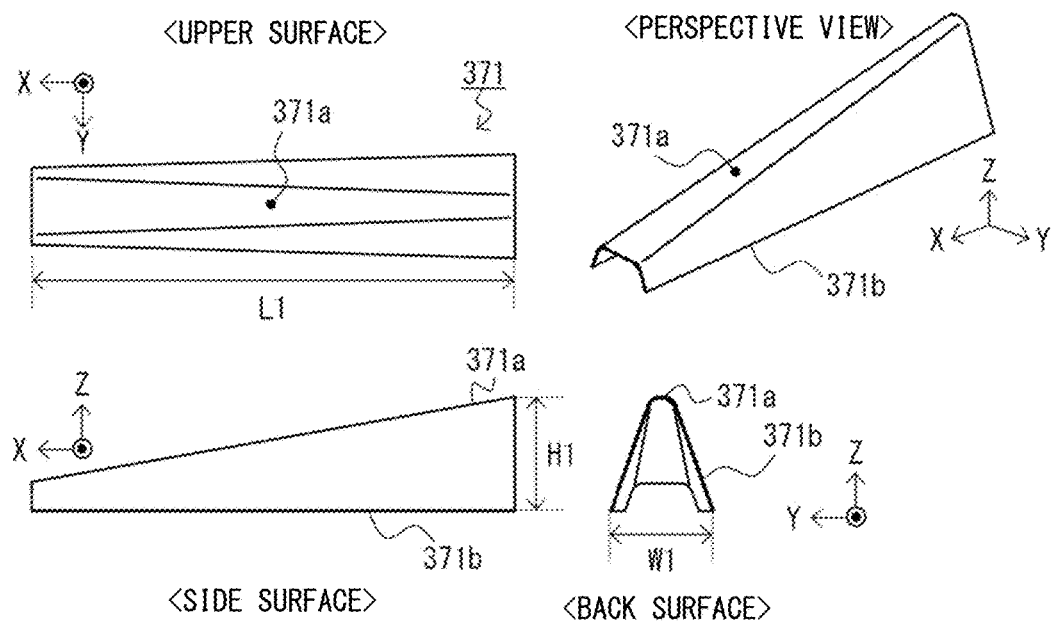
FIG. 37 illustrates drawings describing the shape of a comparative example element viewed from an upper surface, a side surface, an oblique direction, and a back surface.

In order to verify the influence of the matching circuit of the present invention on the antenna size, the inventor of the present invention prepared a comparative example element and an example element that can resonate at the frequency in use. FIG. 37 illustrates drawings describing the shape and the size of the comparative example element. The front or forward direction of a vehicle to which the antenna device is attached is denoted as X, the width direction is denoted as Y, and the height direction from the ground is denoted as Z. A comparative example element 371 is a conductor plate in a shark-fin shape having a top portion 371a that becomes broader in width and lower in height toward the front and that expands toward a bottom portion 371b that is closest to the ground surface. A length L1 in the X direction is 94 mm, a maximum width W1 is 15 mm, and a maximum height H1 is 20 mm.

Figure 38:
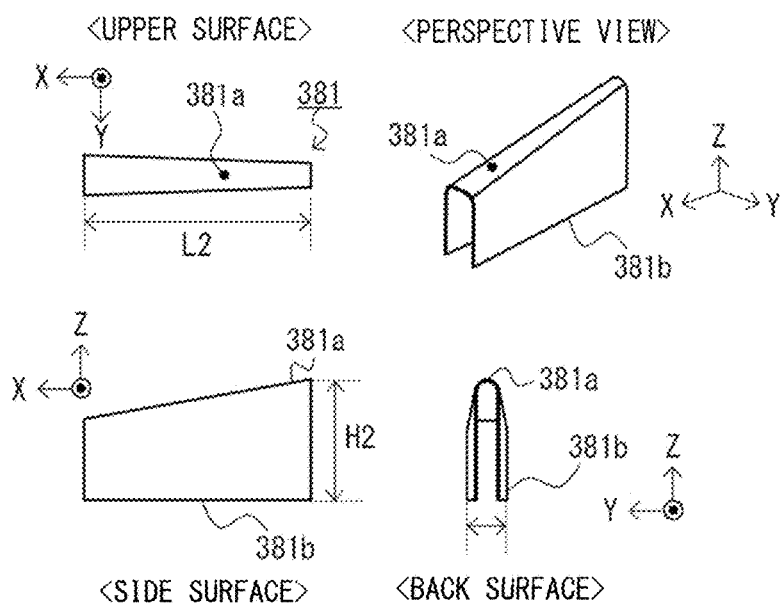
FIG. 38 shows drawings describing the shape of an example element viewed from an upper surface, a side surface, an oblique direction, and a back surface.

On the other hand, the example element is of the shape and the size shown in FIG. 38. That is, the example element 381 is a conductor plate having a length L2 in the X direction of 34 mm, a maximum width W2 of 4 mm, a maximum height H2 of 20 mm, and of the same material and the same thickness as those of the comparative example element 371.

Although the example element 381 is significantly smaller than the comparative element 371 and has atop portion 381a having a similar shape to that of the comparative element 371, the example element 381 does not expand toward a bottom portion 381b.

An antenna device in which Comparative Example 5 described above, that is, the matching circuit disclosed in Patent Literature 1 that is cited as an example of the prior art is connected, as a comparative example matching circuit, to an antenna having the comparative element 371 is referred to as an antenna device of Comparative Example 1. In addition, an antenna device in which the above-described comparative example matching circuit is connected to an antenna having the example element 381 is referred to as an antenna device of Comparative Example 2. Further, an antenna device in which the matching circuit 330 of the shunt L, the series C, the shunt L, and the series C described in the third embodiment is connected, as an example matching circuit, to an antenna having the example element 381 is referred to as an antenna device of the example.

Figure 39:
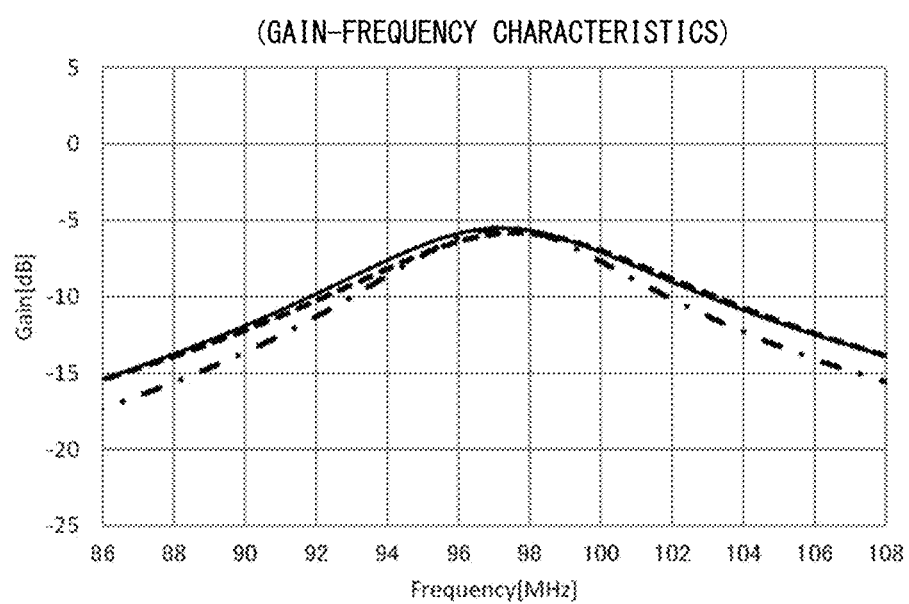
FIG. 39 is a diagram showing operating characteristics of an antenna device of Comparative Example 1, an antenna device of Comparative Example 2, and an antenna device of the example.

The gain-frequency characteristic diagram of these antenna devices is shown in FIG. 39. In FIG. 39, the horizontal axis represents a frequency (MHz) and the vertical axis represents a gain (dB). In addition, the solid line represents the characteristics of the antenna device of Comparative Example 1, the one-dot chain line represents the characteristics of the antenna device of Comparative Example 2, and the dotted line represents the characteristics of the antenna device of the example.

As shown in FIG. 39, in the antenna device of Comparative Example 1, the gain at 87.5 MHz is −14.2 dB, the gain at 108 MHz is −13.9 dB, and the in-band average gain is −8.7 dB. In addition, in the antenna device of Comparative Example 2, the gain at 87.5 MHz is −16.1 dB, the gain at 108 MHz is −15.6 dB, and the in-band average gain is −9.4 dB. Therefore, in the antenna device of Comparative Example 2 having the example element 381 whose size is relatively small, the bandwidth is narrower and the gains are also smaller than those of the antenna device of Comparative Example 1.

On the other hand, in the antenna device of the example, the gain at 87.5 MHz is −14.3 dB, the gain at 108 MHz is −13.8 dB, and the in-band average gain is −8.9 dB. Therefore, even with the antenna having the example element 381 whose size is relatively small, the gain-frequency characteristics equivalent to those of the antenna device of Comparative Example 1 are obtained. In particular, in the ranges of from 76 MHz to 95 MHz and from 87 MHz to 108 MHz, the gain-frequency characteristics and the deviation equivalent to those of the antenna device of Comparative Example 1 are maintained.

This fact means that, for example, in a case where the gain-frequency characteristics of the antenna device of the conventional type such as the antenna device of Comparative Example 1 are sufficient for the demand, by replacing the comparative example matching circuit with the example matching circuit, an antenna device having an antenna case can be further reduced in size by shortening the length of the antenna and narrowing the width thereof. That is, it is revealed that the matching circuit of the present invention also contributes to a reduction in antenna size.

The shape and the size of the example element 381 shown in FIG. 38 is illustrative only, and only the maximum width W2 may be narrowed, or only the length L2 may be shortened.

Alternatively, the maximum height H2 can be shortened by adjusting the length L2 and the maximum width W2.

In addition, the example element 381 is not limited to the conductive plate, and it has been confirmed that substantially equivalent operating characteristics can be obtained even in a case where the example element 381 is configured with a conductive pattern or a conductive paint applied to a resin formed on a substrate. In addition, the example element 381 may be a film-like conductive element, and the shape thereof may be not only a planar shape but also a meander shape or a fractal shape.

Further, the example element 381 may be an element having a slit or a slot. In addition, a pair of planar example elements may be opposed to each other and connected at an arbitrary position.

The example matching circuit may use other matching circuits such as matching circuits 30 or 230 instead of the matching circuit 330 described in the third embodiment.

As described in the above, according to the present invention, it is possible to reduce the difference between a maximum value and a minimum value of gain when viewed from the entire frequency band that can be received.

What is claimed is:

1. An antenna device configured to be attached to a vehicle, comprising:
   an antenna of a resonance type; and
   a matching circuit connected to the antenna,
   wherein the matching circuit includes a first matching circuit connected to a feeding portion of the antenna and a second matching circuit connected to a subsequent stage of the first matching circuit,
   wherein the first matching circuit reduces an impedance in a frequency band that is away to a higher-frequency range or a lower-frequency range from a resonance point of the antenna such that the impedance is lower than before connection of the first matching circuit, and the second matching circuit increases an impedance in a vicinity of the resonance point of the antenna such that the impedance is higher than before connection of the second matching circuit.

2. The antenna device according to claim 1, wherein: the first matching circuit includes a first reactance element of a grounded type; and
   the second matching circuit includes a second reactance element that is a non-grounded type and has a polarity different from that of the first reactance element.

3. The antenna device according to claim 1, wherein: the antenna is an antenna in which an impedance is capacitive in a first frequency band, and the impedance is inductive in a second frequency band that is higher than the first frequency band; and the first matching circuit makes the impedance in the second frequency band of the antenna more capacitive than before connection of the circuit.

4. The antenna device according to claim 1, wherein: the antenna is an antenna in which an impedance is capacitive in a first frequency band, and the impedance is inductive in a second frequency band that is higher than the first frequency band; and the first matching circuit makes the impedance in the first frequency band of the antenna more inductive than before connection of the circuit.

5. The antenna device according to claim 1, wherein the matching circuit is configured by a plurality of sets of the first matching circuit and the second matching circuit connected in cascade.

6. The antenna device according to claim 1, wherein the matching circuit includes a third matching circuit of a non-grounded type connected to a preceding stage of the first matching circuit.

7. A matching circuit connected to an antenna of a resonance type, comprising:
   a first matching circuit connected to a feeding portion of the antenna; and
   a second matching circuit connected to a subsequent stage of the first matching circuit,
   wherein the first matching circuit reduces an impedance in a frequency band that is away to a higher-frequency range or a lower-frequency range from a resonance point of the antenna such that the impedance is lower than before connection of the first matching circuit, and the second matching circuit increases an impedance in the vicinity of the resonance point of the antenna such that the impedance is higher than before connection of the second matching circuit.

* * * * *